(12) United States Patent
Chang et al.

(10) Patent No.: US 12,538,570 B2
(45) Date of Patent: Jan. 27, 2026

(54) REDUCTION OF GATE-DRAIN CAPACITANCE

(71) Applicant: Taiwan Semiconductor Manufacturing Co., Ltd., Hsinchu (TW)

(72) Inventors: Jung-Hung Chang, Changhua County (TW); Lo-Heng Chang, Hsinchu (TW); Zhi-Chang Lin, Hsinchu County (TW); Shih-Cheng Chen, Taipei (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 766 days.

(21) Appl. No.: 17/874,478

(22) Filed: Jul. 27, 2022

(65) Prior Publication Data
US 2022/0367463 A1 Nov. 17, 2022

Related U.S. Application Data

(62) Division of application No. 16/888,537, filed on May 29, 2020, now Pat. No. 11,532,626.

(51) Int. Cl.
| | | |
|---|---|---|
| H10D 84/85 | (2025.01) | |
| H01L 21/02 | (2006.01) | |
| H10D 30/01 | (2025.01) | |
| H10D 30/62 | (2025.01) | |
| H10D 62/13 | (2025.01) | |
| H10D 62/17 | (2025.01) | |
| H10D 64/01 | (2025.01) | |
| H10D 84/01 | (2025.01) | |
| H10D 84/03 | (2025.01) | |

(52) U.S. Cl.
CPC ..... *H10D 84/853* (2025.01); *H01L 21/02129* (2013.01); *H01L 21/0214* (2013.01); *H10D 30/024* (2025.01); *H10D 30/62* (2025.01); *H10D 62/151* (2025.01); *H10D 62/292* (2025.01); *H10D 64/017* (2025.01); *H10D 84/0167* (2025.01); *H10D 84/017* (2025.01); *H10D 84/0193* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 9,818,872 B2 | 11/2017 | Ching et al. | |
| 9,887,269 B2 | 2/2018 | Ching et al. | |

(Continued)

*Primary Examiner* — Steven B Gauthier
*Assistant Examiner* — Lamont B Koo
(74) *Attorney, Agent, or Firm* — HAYNES AND BOONE, LLP

(57) ABSTRACT

A semiconductor device according to the present disclosure includes a bottom dielectric feature on a substrate, a plurality of channel members directly over the bottom dielectric feature, a gate structure wrapping around each of the plurality of channel members, two first epitaxial features sandwiching the bottom dielectric feature along a first direction, and two second epitaxial features sandwiching the plurality of channel members along the first direction.

20 Claims, 32 Drawing Sheets

(56) References Cited

U.S. PATENT DOCUMENTS

| | | | |
|---|---|---|---|
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,840,146 B1* | 11/2020 | Paul | H10D 64/017 |
| 2015/0064869 A1 | 3/2015 | Hong | |
| 2017/0110554 A1 | 4/2017 | Tak | |
| 2018/0145176 A1* | 5/2018 | Wei | H10D 62/151 |
| 2018/0151450 A1 | 5/2018 | Ching | |
| 2018/0175036 A1 | 6/2018 | Ching et al. | |
| 2018/0301560 A1 | 10/2018 | Wei | |
| 2021/0305420 A1* | 9/2021 | Frougier | H10D 30/43 |

* cited by examiner

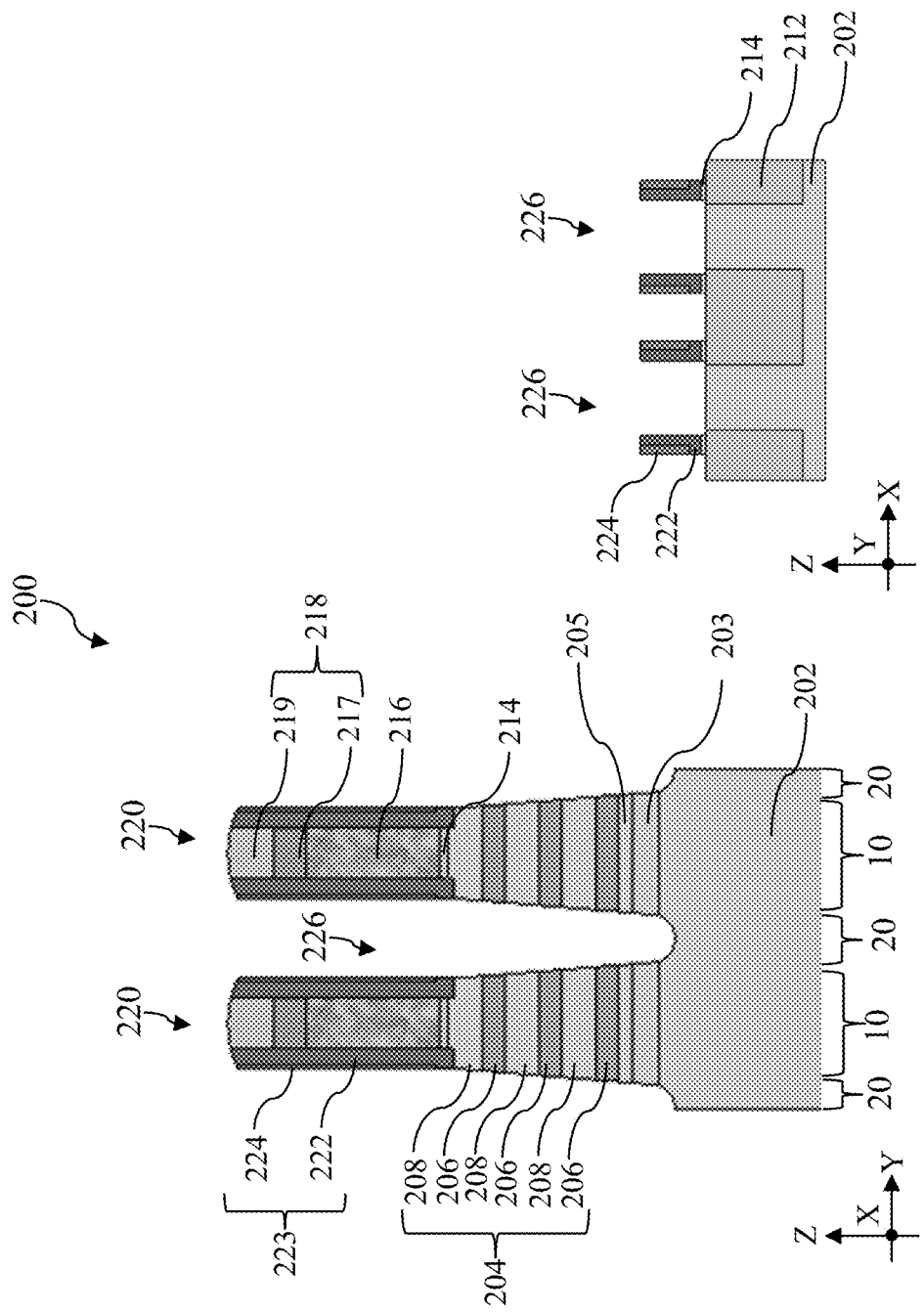

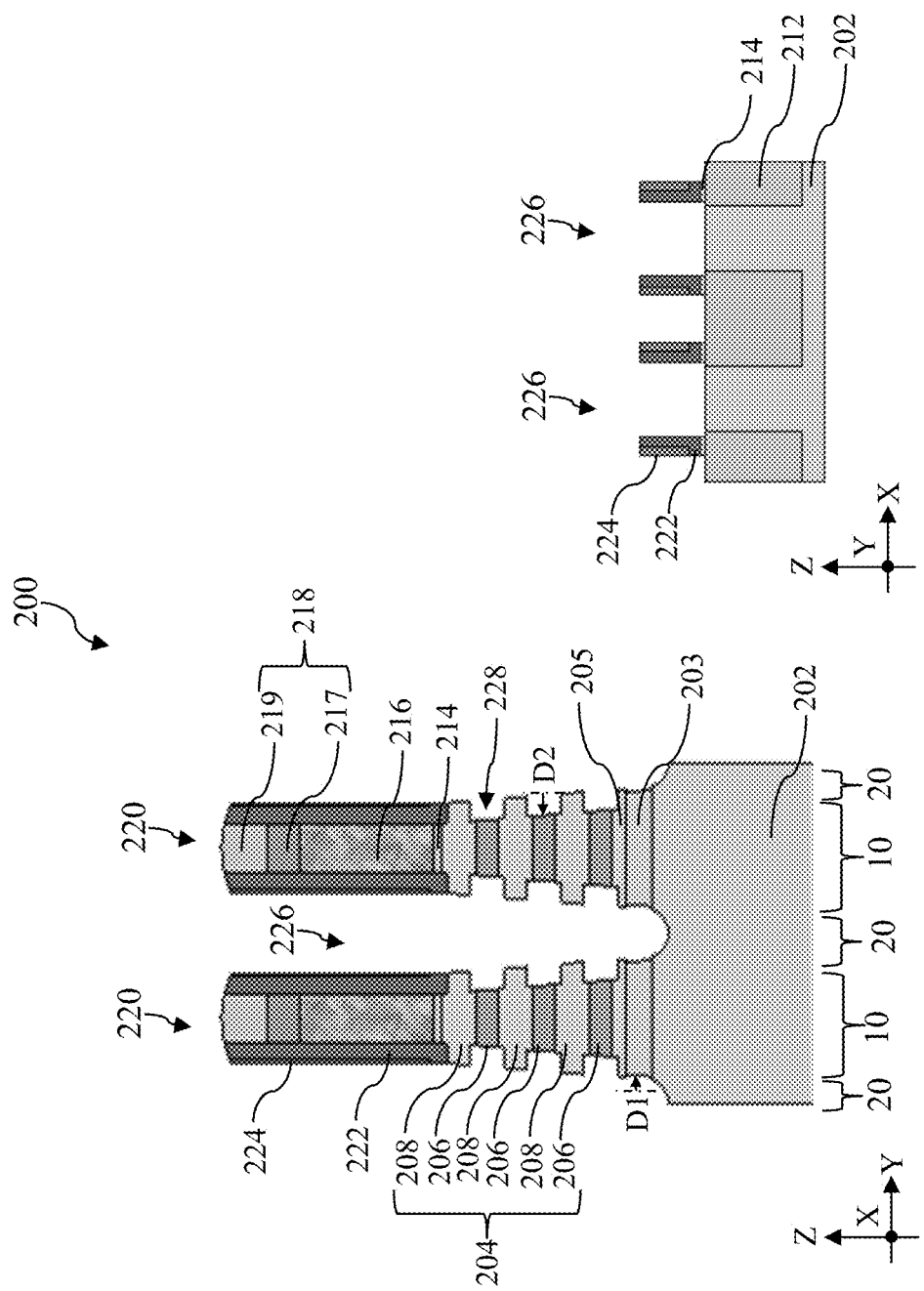

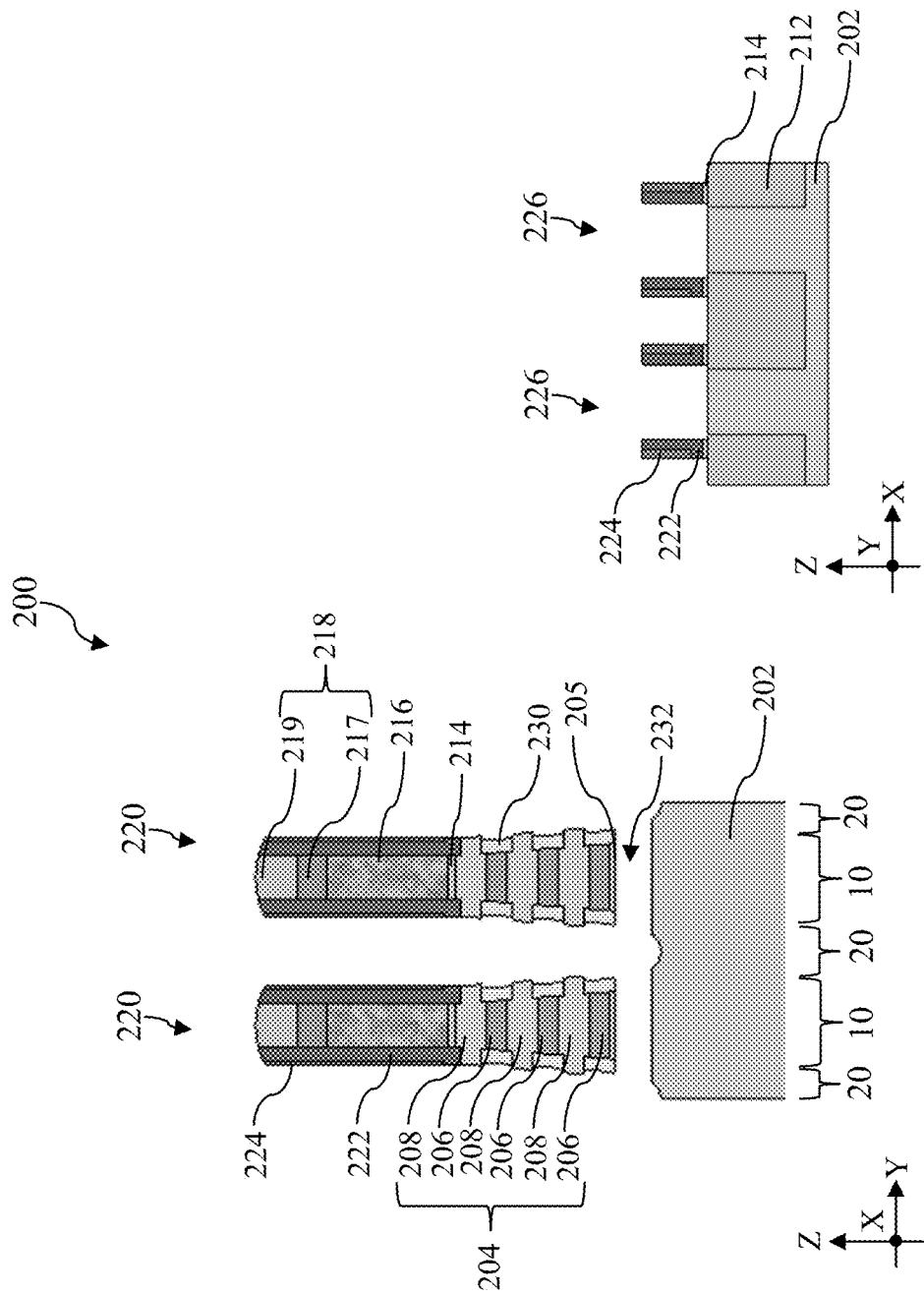

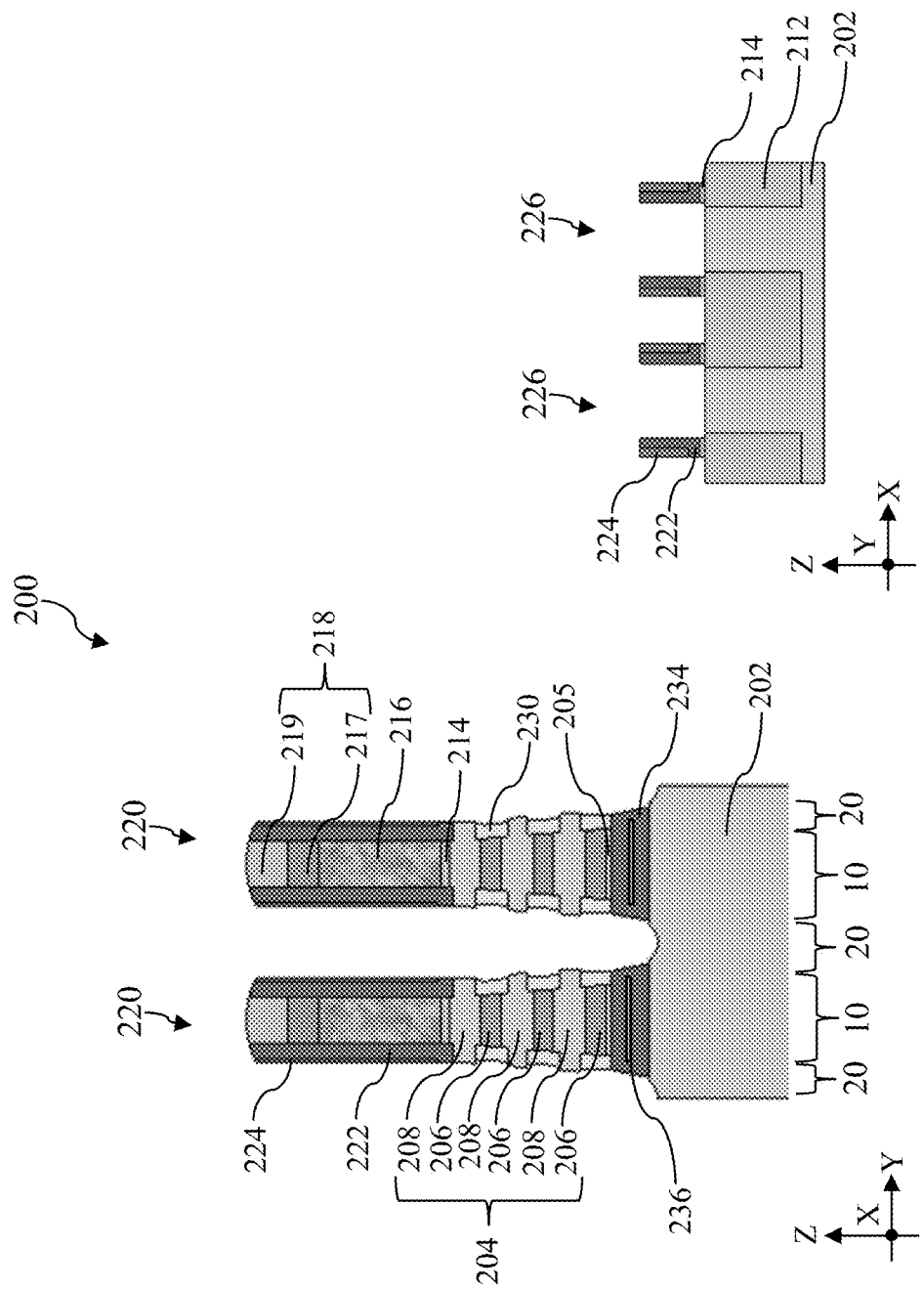

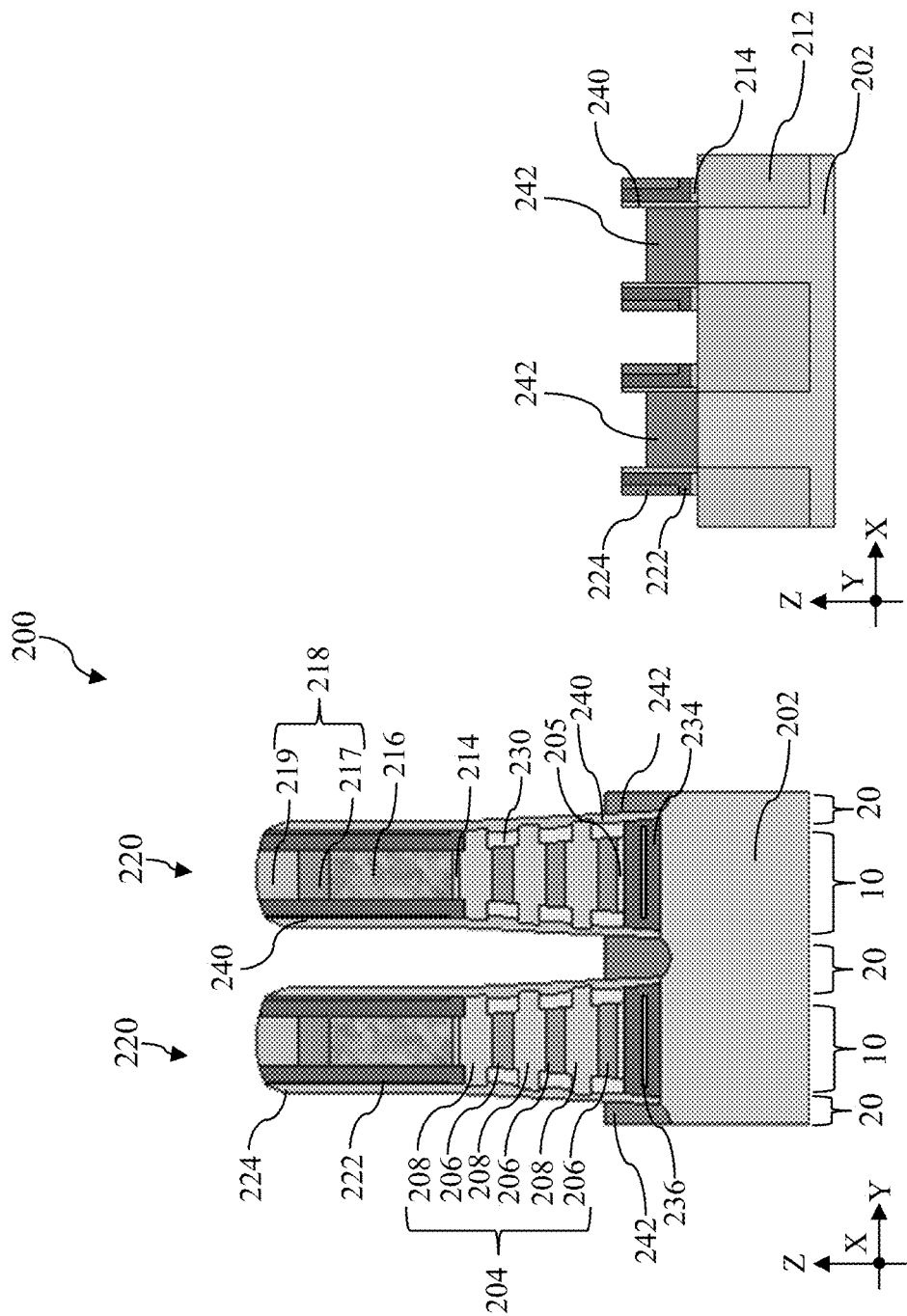

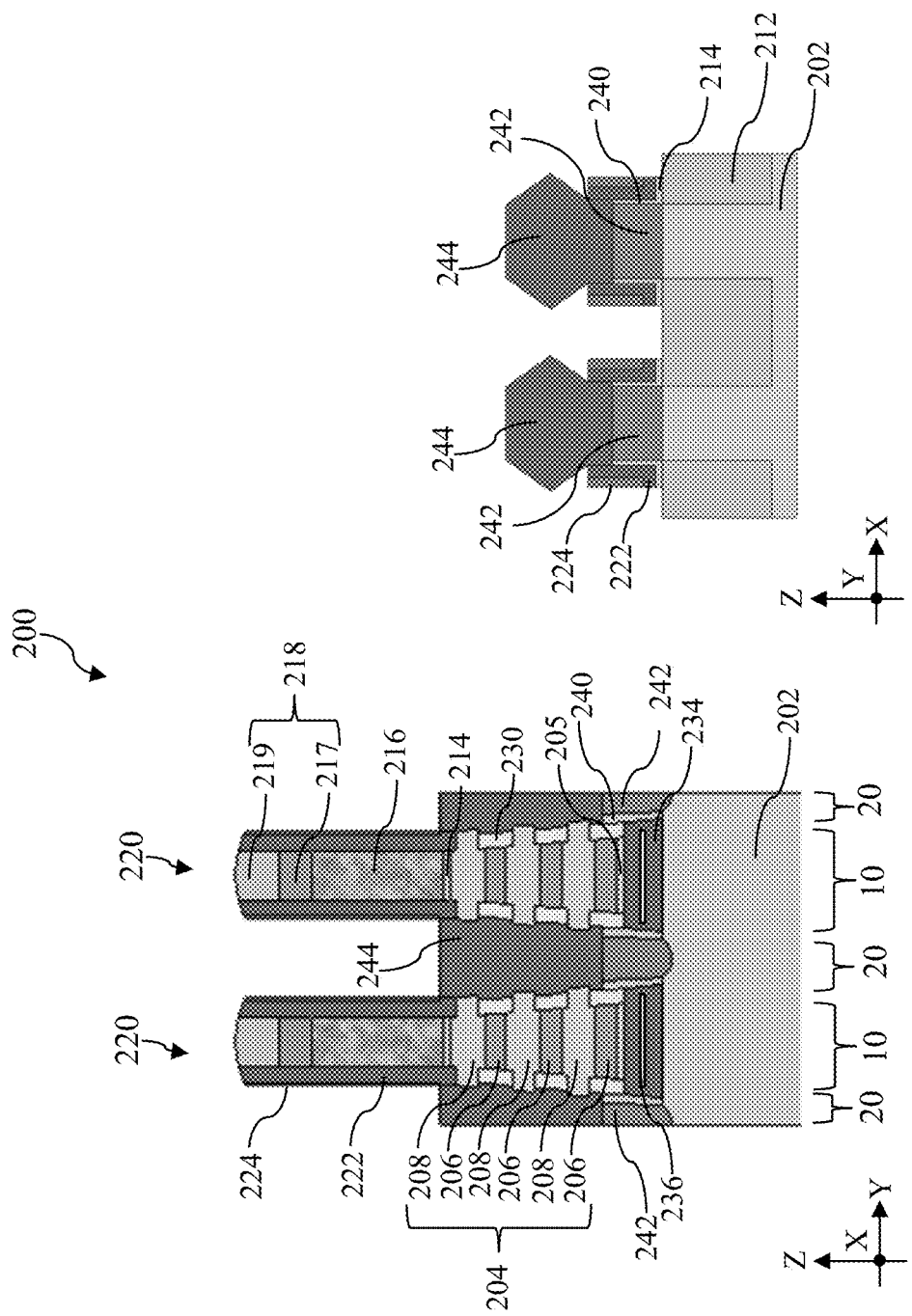

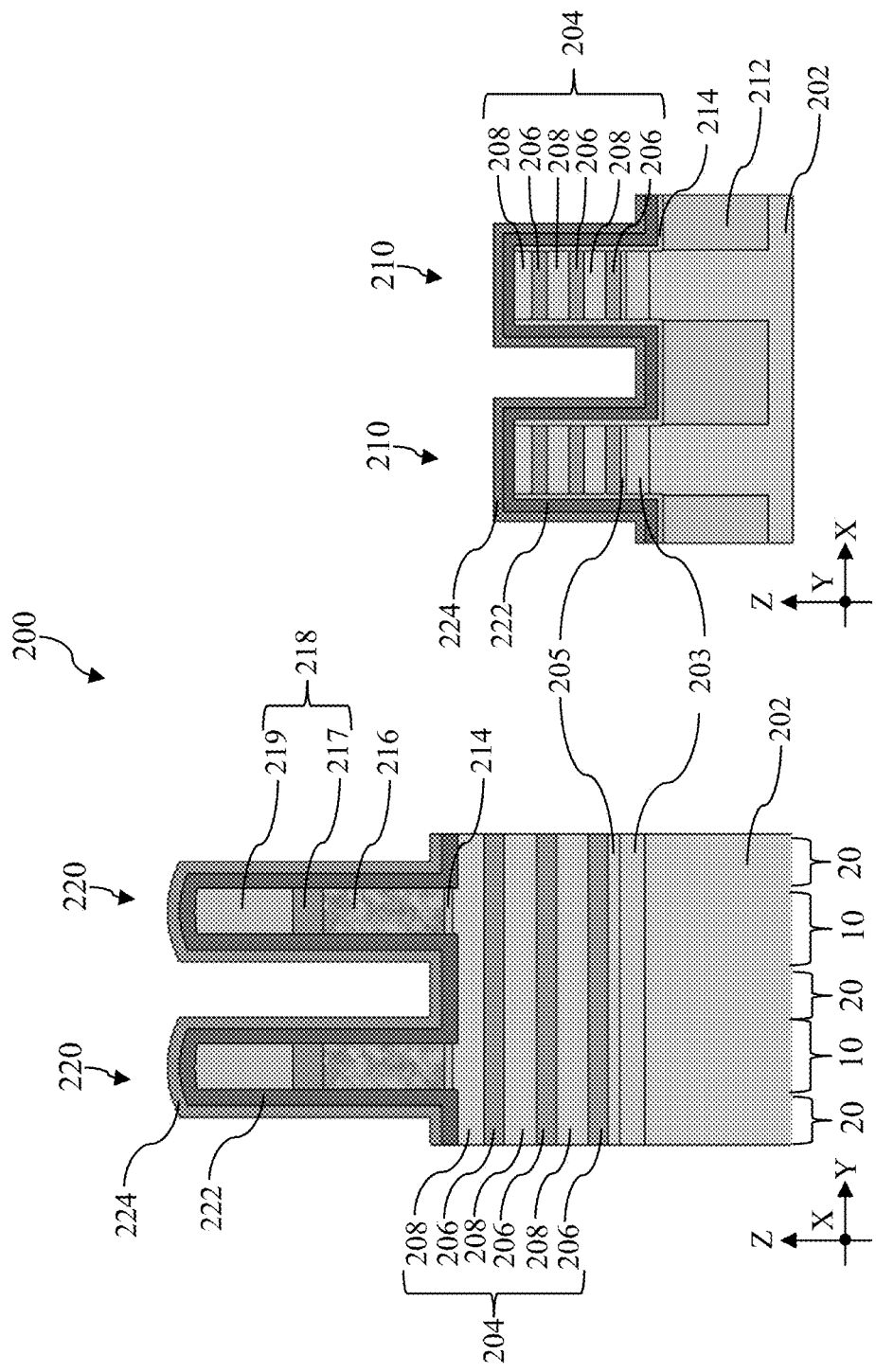

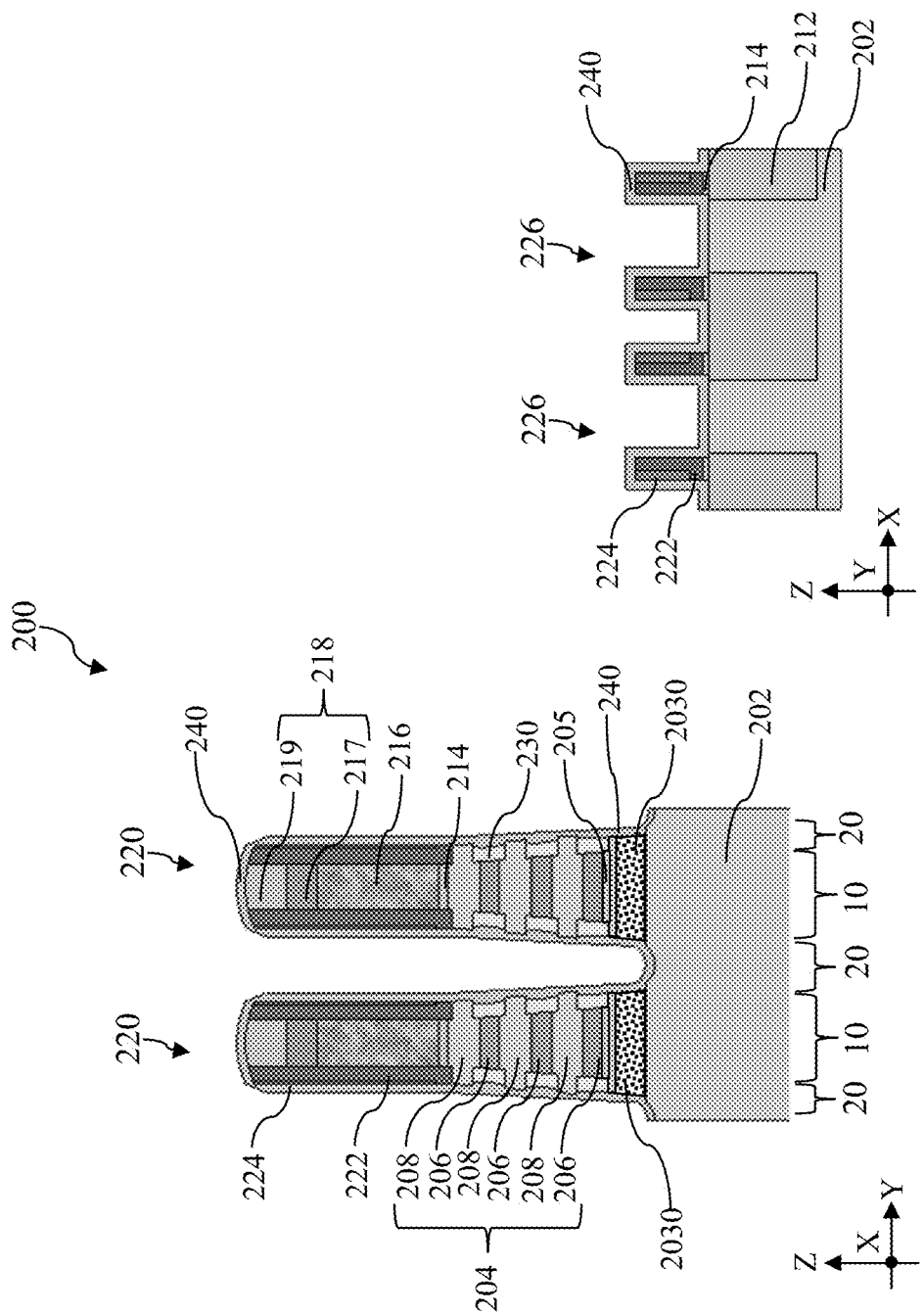

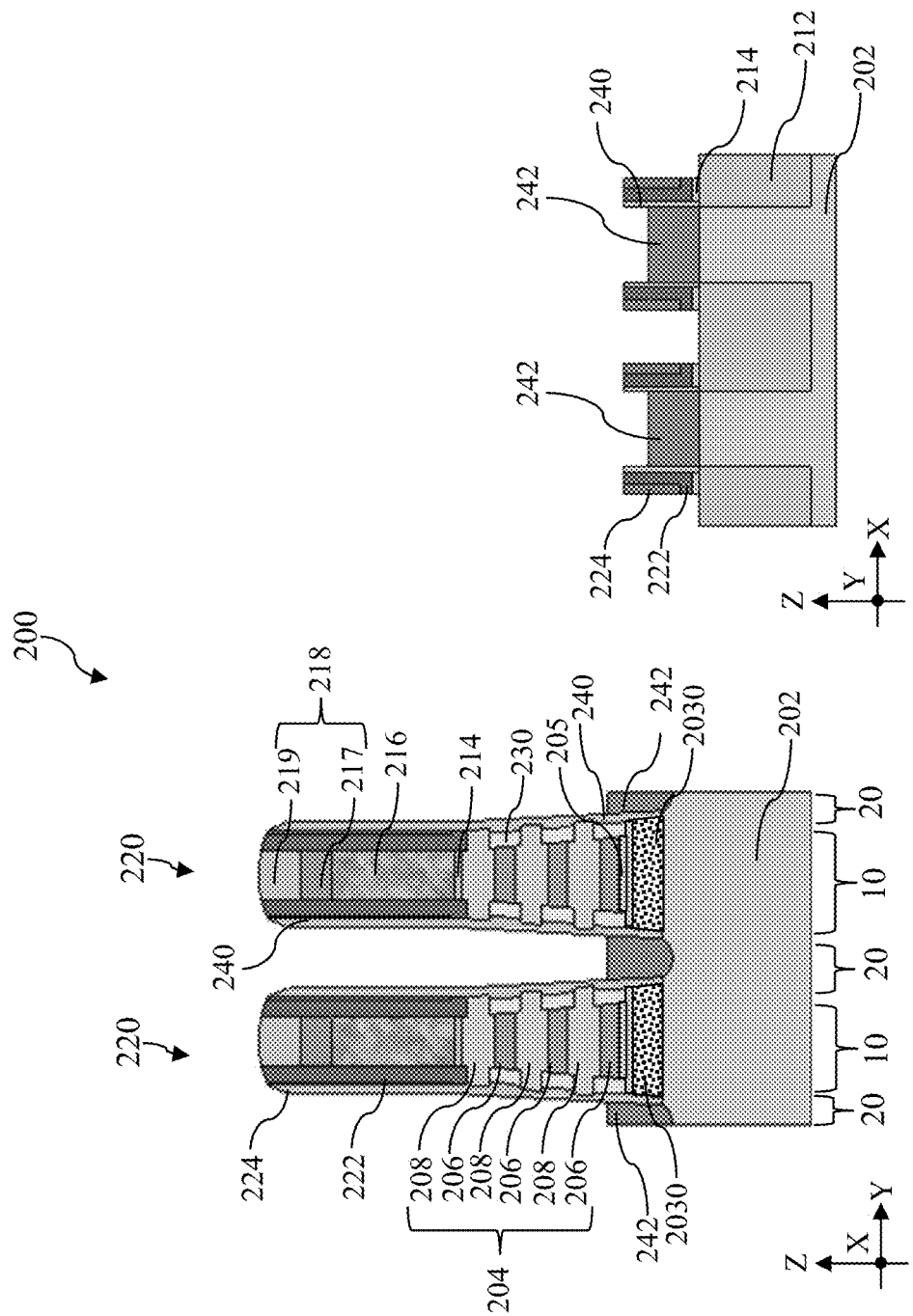

REDUCTION OF GATE-DRAIN CAPACITANCE

PRIORITY DATA

This application is a divisional application of U.S. patent application Ser. No. 16/888,537, filed May 29, 2020, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. As the spacings between gate structures and source/drain features in multi-gate devices shrink, the capacitance between gate structures and source/drain features (sometimes referred to as gate-drain capacitance ($C_{gd}$)) may become critical to device performance, especially in high frequency applications. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4A, 4B, 5A, 5B, 6A, 6B, 7A, 7B, 8A, 8B, 9, 10A, 10B, 11A, 11B, 12A, 12B, 13A, 13B, 14A, 14B, 15, 16, and 17 illustrate fragmentary cross-sectional views of a workpiece during a fabrication process according to the method of FIG. 1, according to one or more aspects of the present disclosure.

FIGS. 19, 20, 21A, 21B, 22A, 22B, 23A, 23B, 24A, 24B, 25A, 25B, 26A, 26B, 27A, 27B, 28A, 28B, 29A, 29B, 30, 31, and 32 illustrate fragmentary cross-sectional views of a workpiece during a fabrication process according to the method of FIG. 18, according to one or more aspects of the present disclosure.

DETAILED DESCRIPTION

Figure 1:
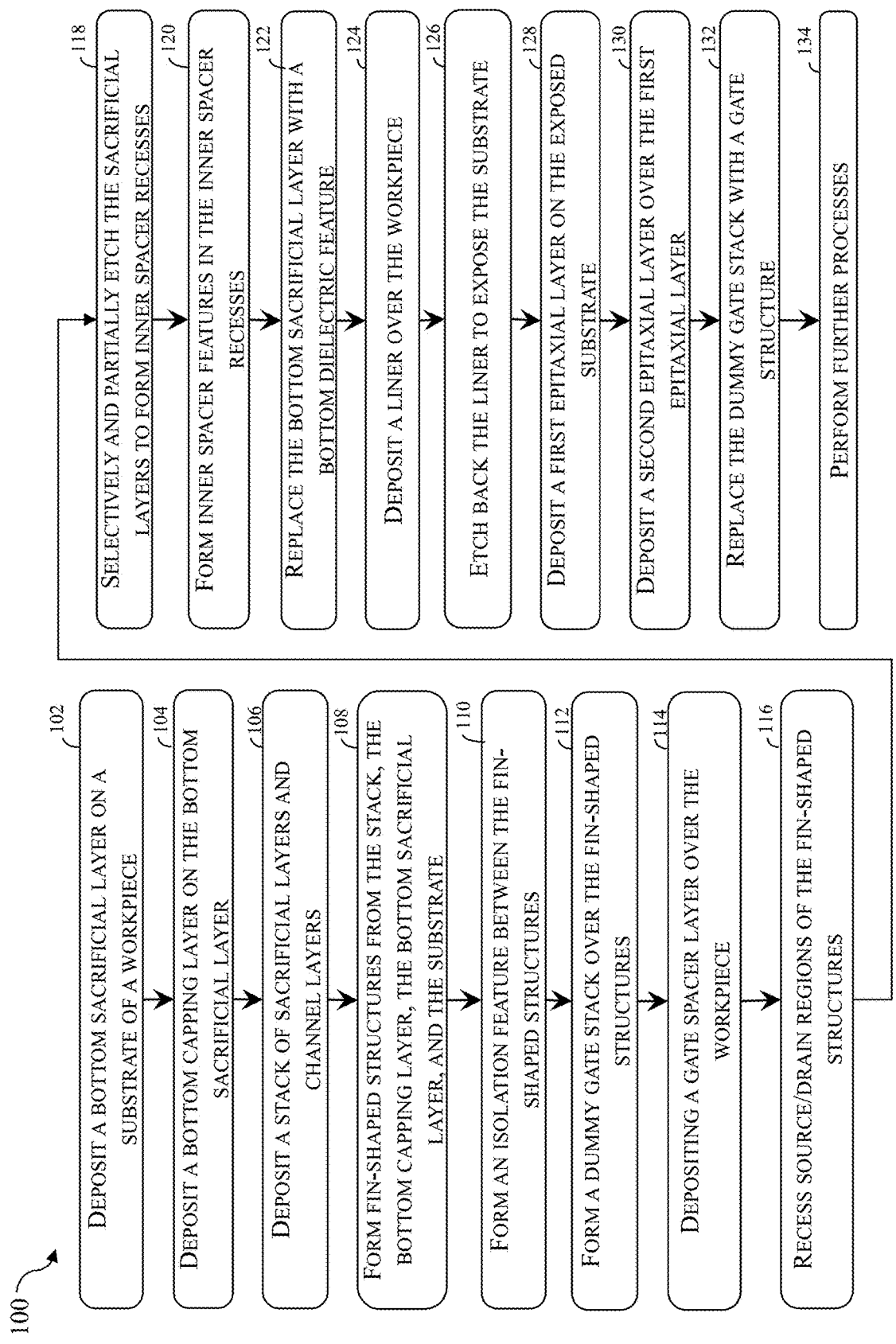
FIG. 1 illustrates a flow chart of a method for forming a semiconductor device having a bottom dielectric layer, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to multi-gate transistors having a bottom dielectric layer to reduce gate-drain capacitance.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, bridge-shaped channel members, and/or other suitable channel configurations. In an MBC transistor, as the channel region is adjacent to the source/drain region, additional gate-drain capacitance may be formed between an epitaxial source/drain feature in the source/drain region and a gate structure in the channel region when the epitaxial source/drain feature extends to a level below a bottom surface of the gate structure. Additionally, stray dopants may be present in the bulk substrate under the channel region, creating leakage paths. Both the additional gate-drain capacitance and leakage path may impact the performance of the MBC transistor.

The present disclosure provides embodiments of a semiconductor device where a bottom dielectric feature or a bottom oxide feature insulates the channel region from the bulk substrate. To form the bottom dielectric feature or bottom oxide feature, methods of the present disclosure form a bottom sacrificial layer and a bottom capping layer on a substrate before forming a stack of alternating semiconductor layers. After the formation of a fin-shaped structure from the substrate, the bottom sacrificial layer, the bottom capping layer, and the stack, the bottom sacrificial layer is patterned into a bottom sacrificial feature. Operations of the methods of the present disclosure replace the bottom sacrificial feature with a bottom dielectric feature or oxidize the bottom sacrificial feature into a bottom oxide feature. Methods of the present disclosure also include operations to form the epitaxial source/drain features in two stages. A first epitaxial feature, which may be formed of undoped semiconductor material, is first formed in source/drain recesses to interface with the bottom dielectric feature or the bottom oxide feature. A second epitaxial feature, which may be heavily doped with n-type or p-type dopants and is more conductive than the first epitaxial feature, is then formed over the first epitaxial feature. Both the bottom dielectric feature (or the bottom oxide feature) and the two-stage formation of epitaxial source/drain feature reduce gate-drain capacitance ($C_{gd}$) and leakage.

Figure 18:
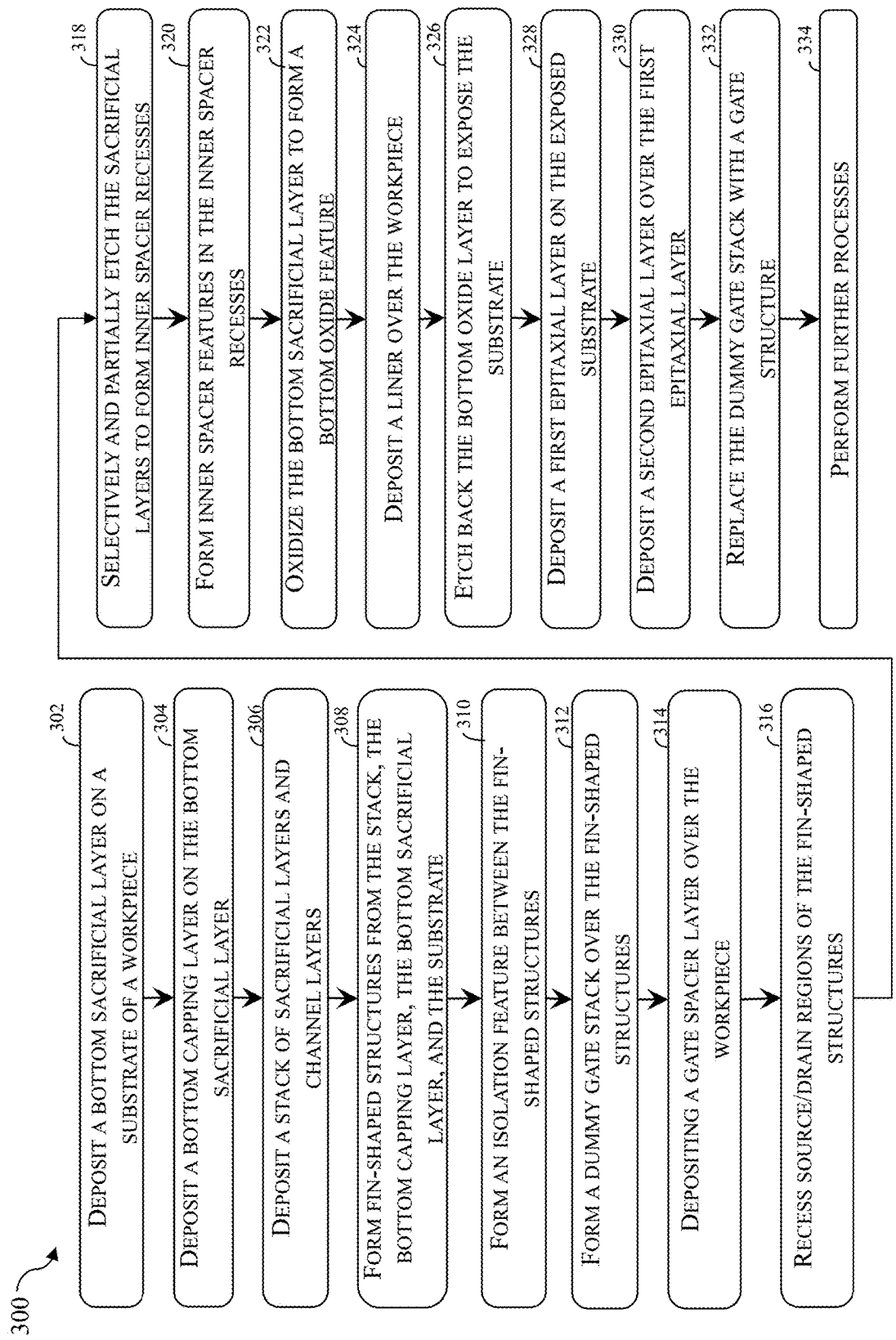
FIG. 18 illustrates a flow chart of a method for forming a semiconductor device having a bottom oxide layer, according to one or more aspects of the present disclosure.

The various aspects of the present disclosure will now be described in more detail with reference to the figures. In that regard, FIGS. 1 and 18 are flowchart illustrating methods 100 and 300 of forming a semiconductor device from a workpiece according to embodiments of the present disclosure. Methods 100 and 300 are merely examples and are not intended to limit the present disclosure to what is explicitly illustrated in methods 100 and 300. Additional steps can be provided before, during and after the methods 100 and 300, and some steps described can be replaced, eliminated, or moved around for additional embodiments of the methods. Not all steps are described herein in detail for reasons of simplicity. Methods 100 and 300 are described below in conjunction with fragmentary cross-sectional views of the semiconductor device at different stages of fabrication according to embodiments of methods 100 and 300. Figures ending with "A" illustrate fragmentary cross-sectional views of the workpiece 200 (or the semiconductor device 200) along the X direction, which is the lengthwise direction of a dummy gate stack or a gate structure. Figures ending with "B" illustrate fragmentary cross-sectional views of the workpiece 200 (or the semiconductor device 200) along the Y direction, which is the lengthwise direction of a fin-shaped structure.

Figure 2:
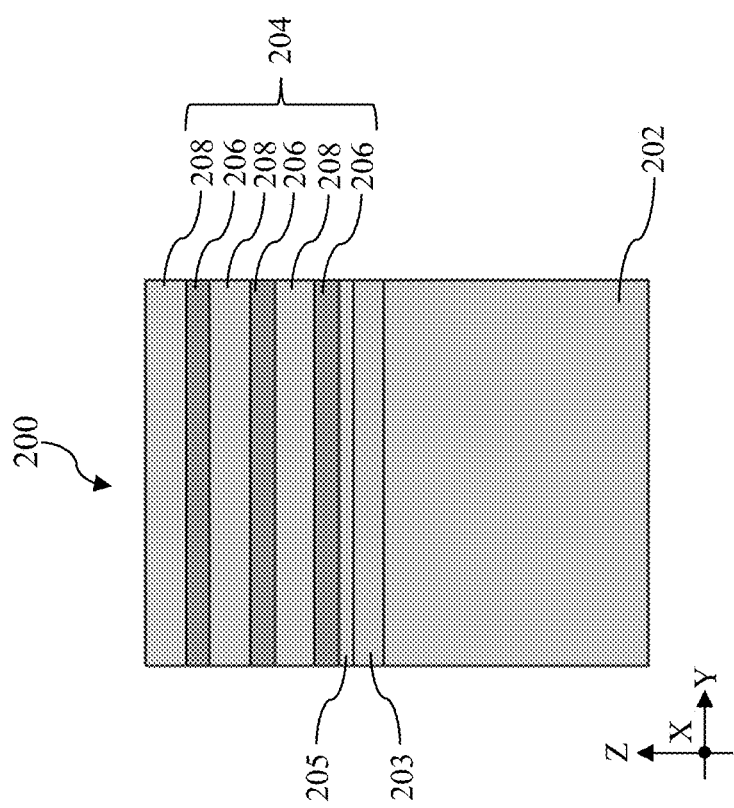

Referring to FIGS. 1 and 2, method 100 includes a block 102 where a bottom sacrificial layer 203 is deposited on a substrate 202 of a workpiece 200. In some embodiments, the substrate 202 may be a semiconductor substrate such as a silicon substrate. The substrate 202 may also include other semiconductors such as germanium, silicon carbide (SiC), silicon germanium (SiGe), or diamond. Alternatively, the substrate 202 may include a compound semiconductor and/or an alloy semiconductor. In the depicted embodiment, the substrate 202 is a silicon substrate. For ease of reference, the substrate 202 and layers or features to be formed thereon may be collectively referred to as the workpiece 200. Because the workpiece 200 will be fabricated into a semiconductor device 200 upon conclusion of the fabrication processes, the workpiece 200 may be referred to as the semiconductor device 200 as the context requires. Further, the exemplary semiconductor devices that can be formed from the workpiece 200 may include various other devices and features, such as other types of devices including additional transistors, bipolar junction transistors, resistors, capacitors, inductors, diodes, fuses, SRAM and/or other logic circuits, etc., but are simplified for a better understanding of the inventive concepts of the present disclosure.

In some embodiments, the bottom sacrificial layer 203 may include a semiconductor material, such as silicon germanium (SiGe). In those embodiments, the bottom sacrificial layer 203 may include a first germanium concentration between about 10% and about 25%. As will be described below, the first germanium concentration of the bottom sacrificial layer 203 allows selectively recess of silicon germanium sacrificial layers (to be described below) that have a different germanium concentration. In some implementations, the bottom sacrificial layer 203 is epitaxially deposited on the substrate 202 using a molecular beam epitaxy (MBE) process, vapor-phase epitaxy (VPE), ultra-high vacuum CVD (UHV-CVD)), a metalorganic chemical vapor deposition (MOCVD) process, and/or other suitable epitaxial growth processes. In some instances, the bottom sacrificial layer 203 is formed to a thickness between about 8 nm and about 10 nm.

Referring to FIGS. 1 and 2, method 100 includes a block 104 where a bottom capping layer 205 is deposited on the bottom sacrificial layer 203. The bottom capping layer 205 includes a semiconductor material different from that forming the bottom sacrificial layer 203. In some embodiments, the bottom capping layer 205 is formed of silicon. In some implementations, the bottom capping layer 205 is epitaxially deposited on the bottom sacrificial layer 203 using an MBE process, a VPE process, an UHV-CVD process, an MOCVD process, and/or other suitable epitaxial growth processes. As will be described below, the bottom capping layer 205 functions to isolate the bottom sacrificial layer 203 from an overlying layer, such as a sacrificial layer in a stack (to be described below). For that reason, the bottom capping layer 205 may require a minimum thickness at about 3 nm. At the same time, because the bottom capping layer 205 is not intended to be formed into a channel member, it may be desirable to remove as much as possible the bottom capping layer 205 in subsequent processes. Consequently, the bottom capping layer 205 may not be thicker than about 4 nm to facilitate satisfactory removal thereof. In view of these considerations, in some embodiments, the bottom capping layer 205 may have a thickness between about 3 nm and about 4 nm.

Referring to FIGS. 1 and 2, method 100 includes a block 106 where a stack 204 of sacrificial layers 206 and channel layers 208 is deposited on the bottom capping layer 205. As illustrated in FIG. 2, the sacrificial layers 206 and the channel layers 208 in the stack 204 are stacked alternatingly such that the sacrificial layers 206 are interleaved by the channel layers 208 and vice versa. The sacrificial layers 206 and the channel layers 208 are formed of different semiconductor materials configured to allow selective removal of sacrificial layers 206 without substantially damaging the channel layers 208. In an embodiment, the sacrificial layers 206 include silicon germanium (SiGe) and the channel layers 208 include silicon (Si). In this embodiment, the sacrificial layers 206 include a second germanium concentration that is greater than the first germanium concentration for the bottom sacrificial layer 203. In some instances, the second germanium concentration is between about 30% and about 45%. It has been observed that the difference in germanium concentration allows the sacrificial layers 206 to be selectively and partially recessed to form inner spacer recesses 228 (shown in FIG. 6A) at block 118 while the bottom sacrificial layer 203 is only minimally recessed. Although even higher second germanium concentration may further increase the selectivity, too high a germanium concentration may impact the crystallinity of the resulting silicon germanium in the sacrificial layers 206. By way of example, the sacrificial layers 206 and the channel layers 208 in the stack 204 may be formed by an MBE process, a VPE process, an UHV-CVD process, an MOCVD process, and/or other suitable epitaxial growth processes.

Other semiconductor materials for the sacrificial layers 206 and the channel layers 208 are fully envisioned. In some alternative embodiments, the sacrificial layers 206 and the channel layers 208 may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the sacrificial layers 206 and the channel layers 208 may be chosen such that the sacrificial layers 206 may be selectively removed or recessed without substantially damaging the channel layers 208.

It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of sacrificial layers and channel layers may be formed in the stack 204. The number of layers depends on the desired number of channels members for the semiconductor device 200. In some embodiments, the number of channel layers 208 is between 2 and 10. In some embodiments, all sacrificial layers 206 may have a substantially uniform first thickness and all of the channel layers 208 may have a substantially uniform second thickness. The first thickness and the second thickness may be identical or different. The channel layers 208 or parts thereof may serve as channel member(s) for a subsequently-formed multi-gate device and the thickness of each of the channel layers 208 is chosen based on device performance considerations. The sacrificial layers 206 may eventually be removed and serve to define a vertical distance between adjacent channel region(s) for a subsequently-formed multi-gate device and the thickness of each of the sacrificial layers 206 is chosen based on device performance considerations.

Figure 3:
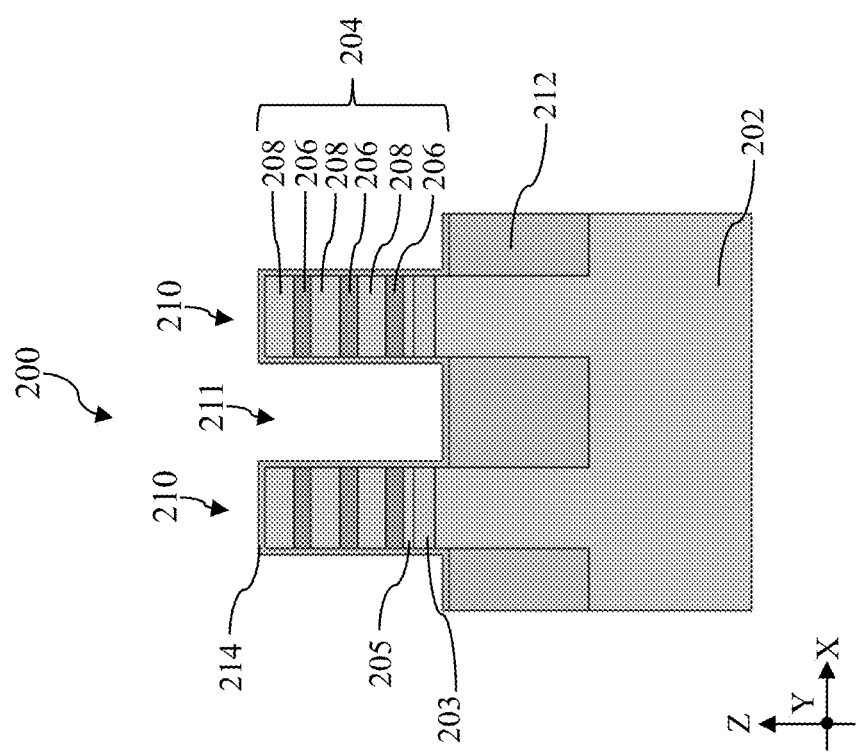

Referring to FIGS. 1 and 3, method 100 includes a block 108 where fin-shaped structures 210 are formed from the stack 204, the bottom capping layer 205, the bottom sacrificial layer 203, and the substrate 202. At block 108, the stack 204, the bottom capping layer 205, the bottom sacrificial layer 203, and a portion of the substrate 202 are patterned using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. While not explicitly shown, one or more hard mask layers may be formed over the stack 204 to facilitate the photolithography process. In some implementations, a nitrogen-containing hard mask layer and an oxygen hard mask layer may be deposited over the stack 204. The nitrogen-containing hard mask layer may include silicon nitride or silicon carbonitride. The oxygen-containing hard mask layer may include silicon oxide or silicon oxycarbide. The etch process may include dry etching (e.g., reactive ion etching (RIE)), wet etching, and/or other etching methods. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The patterned material layer is then removed, and the remaining spacers, or mandrels, may then be used to pattern the fin-shaped structures 210 by etching the stack 204, the bottom capping layer 205, the bottom sacrificial layer 203, and a portion of the substrate 202.

Referring to FIGS. 1 and 3, method 100 includes a block 110 where an isolation feature 212 between the fin-shaped structures 210. In some embodiments, the isolation feature 212 may be deposited in trenches 211 between neighboring fin-shaped structures 210 to isolate them from one another. The isolation feature 212 may also be referred to as a shallow trench isolation (STI) feature 212. By way of example, in some embodiments, a dielectric material is first deposited over the substrate 202, filling the trenches 211 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric layer may be deposited by a spin-on coating process, a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI features 212. The fin-shaped structures 210 rise above the STI features 212 after the recessing.

Figures 4A, 4B:
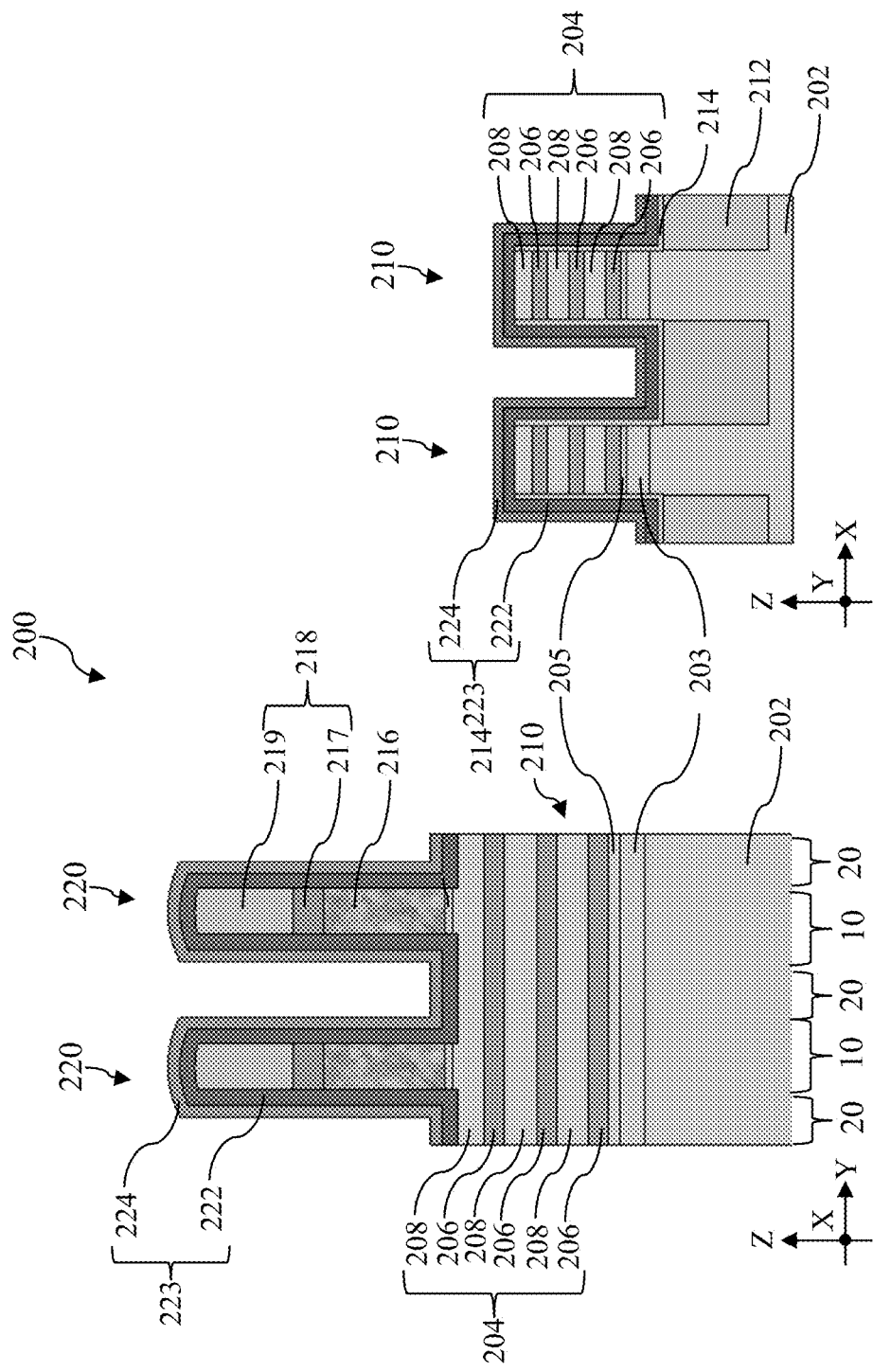

Referring to FIGS. 1, 3, 4A, and 4B, method 100 includes a block 112 where a dummy gate stack 220 is formed over the fin-shaped structures 210. In some embodiments represented in FIGS. 3, 4A and 4B, the dummy gate stack 220 includes a dummy dielectric layer 214 and a dummy electrode layer 216. In those embodiments, a gate-top hard mask layer 218 that is used to pattern the dummy gate stack 220 may remain on top of the dummy electrode layer 216 to protect the dummy electrode layer 216. In the depicted embodiments, the gate-top hard mask layer 218 may be include a nitride hard mask layer 217 and an oxide hard mask layer 219 over the nitride hard mask layer 217. In some implementations, the dummy dielectric layer 214 may include silicon oxide, the dummy electrode layer 216 may include polysilicon, the nitride hard mask layer 217 may include silicon nitride or silicon oxynitride, and the oxide hard mask layer 219 may include silicon oxide. For ease of reference, the dummy gate stack 220 may be used to refer to not only the dummy dielectric layer 214, the dummy electrode layer 216, but also the gate-top hard mask layer 218 (including the nitride hard mask layer 217 and the oxide hard mask layer 219). The dummy gate stack 220 serves as a placeholder to undergo various processes and is to be removed and replaced by the functional gate structure at a later step. As shown in FIG. 4A, the dummy gate stacks 220 are disposed over channel regions 10 of the fin-shaped structure 210. Each of the channel regions 10 is disposed between two source/drain regions 20 along the lengthwise direction of the fin-shaped structure 210, which is aligned with the Y direction. Each of the dummy dielectric layer 214, the dummy electrode layer 216, and the gate-top hard mask layer 218 may be deposited using a CVD process, an ALD process, or a suitable deposition process. Similar to the fin-shaped structures 210, the dummy gate stacks 220 may be patterned using photolithography and etch processes.

In some embodiments represented in FIGS. 4A and 4B, after formation of the dummy gate stack 220, the dummy dielectric layer 214 is removed from the source/drain regions 20 of the fin-shaped structures 210. That is, the dummy dielectric layer 214 not covered by the dummy electrode layer 216 is removed. The removal process may include a wet etch, a dry etch, and/or a combination thereof. The etch process is chosen to selectively etch the dummy dielectric layer 214 without substantially etching the fin-shaped structure 210, the gate-top hard mask layer 218, and the dummy electrode layer 216.

Referring to FIGS. 1, 4A and 4B, method 100 includes a block 114 where a gate spacer layer 223 is deposited over the workpiece 200. The gate spacer layer 223 may be a single layer or a multi-layer. FIGS. 4A and 4B illustrate an example of a multi-layer where the gate spacer layer 223 includes a first spacer layer 222 and a second spacer layer 224. The first spacer layer 222 and the second spacer layer 224 are deposited conformally over the workpiece 200, including over top surfaces and sidewalls of the dummy gate stack 220. The term "conformally" may be used herein for ease of description of a layer having substantially uniform thickness over various regions. The first spacer layer 222 has a lower dielectric constant than the second spacer layer 224 and the second spacer layer 224 etches more slowly than the first spacer layer 222. In some embodiments, the first spacer layer 222 may include silicon oxide, silicon oxycarbide, or a suitable low-k dielectric material. The second spacer layer 224 may include silicon carbonitride, silicon nitride, zirconium oxide, aluminum oxide, or a suitable dielectric material. The first spacer layer 222 and the second spacer layer 224 may be deposited over the dummy gate stack 220 using processes such as, CVD process, a subatmospheric CVD (SACVD) process, a flowable CVD process, an ALD process, a PVD process, or other suitable process. As shown in FIG. 4B, the gate spacer layer 223 is not only disposed over sidewalls and top surfaces of the dummy gate stacks 220 in the channel regions 10 but also over sidewalls and top surfaces of the fin-shaped structures 210 in the source/drain regions 20. While not explicitly shown in FIGS. 4A and 4B, the gate spacer layer 223 may be etched back in an anisotropic etch process to remove the gate spacer layer 223 from portions of a top surface of the fin-shaped structure 210 not covered by the dummy gate stack 220, thereby exposing the source/drain regions 20. Portions of the gate spacer layer 223 directly over the dummy gate stack 220 may be completely removed by this anisotropic etch process while the gate spacer layer 223 remains on sidewalls of the dummy gate stack 220.

Referring to FIGS. 1, 5A and 5B, method 100 includes a block 116 where source/drain regions 20 of the fin-shaped structures 210 are recessed. While not explicitly shown, a photolithography process and at least one hard mask may be used to perform operations at block 116. In some embodiments, the source/drain regions 20 of the fin-shaped structures 210 that are not covered by the dummy gate stack 220 and the gate spacer layer 223 are etched by a dry etch or a suitable etching process to form the source/drain recesses 226. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIGS. 5A and 5B, the source/drain regions 20 of the fin-shaped structure 210 are recessed to expose sidewalls of the sacrificial layers 206 and the channel layers 208 in the source/drain recesses 226. As shown in FIG. 5A, the recess at block 116 continues downward through the bottom sacrificial layer 203 and extends into a portion of the substrate 202. At this point, the continuous bottom sacrificial layer 203 and bottom capping layer 205 are divided into bottom sacrificial features 203 and bottom capping features 205 in the channel regions 10 of the fin-shaped structure 210.

Referring to FIGS. 1, 6A and 6B, method 100 includes a block 118 where the sacrificial layers 206 are selectively and partially etched to form inner spacer recesses 228. At block 118, the sacrificial layers 206 exposed in the source/drain recesses 226 are selectively and partially recessed along the Y direction to form inner spacer recesses 228 while the gate spacer layer 223, the channel layers 208, and the bottom capping feature 205 are substantially unetched. In embodiments where both the bottom sacrificial feature 203 and the sacrificial layers 206 are both formed of silicon germanium, the bottom sacrificial feature 203 may also be recessed, albeit moderately due to the lower germanium concentration. As described above, the lower first germanium concentration in the bottom sacrificial feature 203 allows it to be etched more slowly than the sacrificial layers 206 that has a higher second germanium concentration. In some implementations illustrated in FIG. 6A, the bottom sacrificial feature 203 may be recessed by a first depth D1 and each of the sacrificial layers 206 may be recessed by a second depth D2. The second depth D2 is greater than the first depth D1. In some instances, the first depth D1 may be less than about 1 nm and the second depth D2 is between about 5 nm and about 9 nm. The second depth D2 is the Y-direction dimension of the inner spacer recess 228. In embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

Figures 7A, 7B:
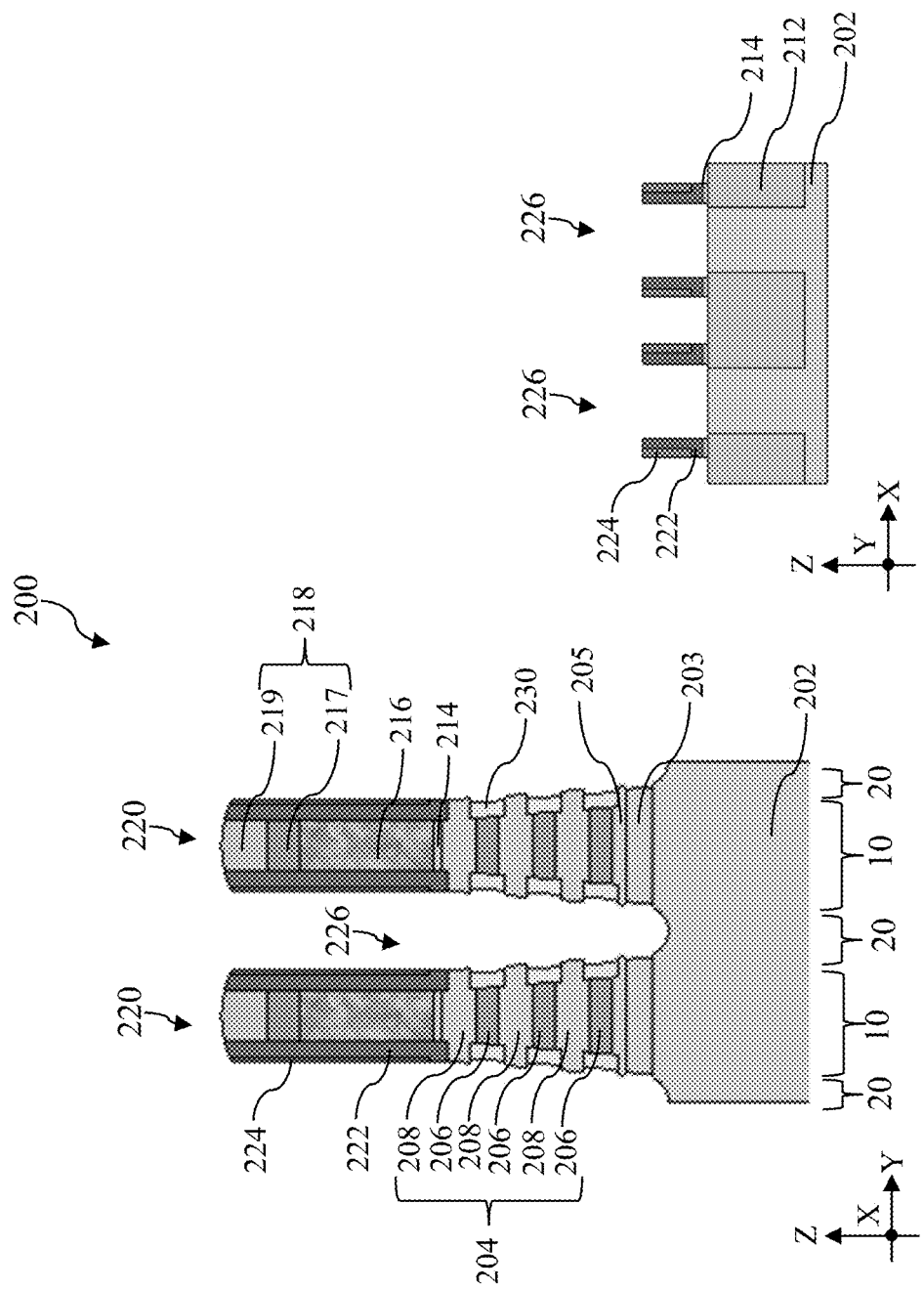

Referring to FIGS. 1, 7A and 7B, method 100 includes a block 120 where inner spacer features 230 are formed in the inner spacer recesses 228. In some embodiments, operations at block 120 may include blanket deposition of an inner spacer material layer over the workpiece 200 and an etchback of the inner spacer material layer to form the inner spacer features 230. The inner spacer material layer may be a single layer or a multilayer. In some implementations, the inner spacer material layer may be deposited using CVD, PECVD, LPCVD, ALD or other suitable method. The inner spacer material layer may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. The deposited inner spacer material layer is then etched back to remove the inner spacer material layer from the sidewalls of the channel layers 208 to obtain the inner spacer features 230 in the inner spacer recesses 228. At block 120, the inner spacer material layer may also be removed from the top surfaces of dummy gate stack 220, the gate spacer layer 223, and the isolation features 212. In some embodiments, the composition of the inner spacer material layer is selected such that the inner spacer material layer may be selectively removed without substantially etching the gate spacer layer 223. In some implementations, the etch back operations performed at block 120 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 7A, each of the inner spacer features 230 is in direct contact with the recessed sacrificial layers 206 and is disposed between two neighboring channel layers 208. In some implementations, because the first depth D1 in the bottom sacrificial feature 203 is shallow (i.e., less than 1 nm along the Y direction), the etch back may remove the inner spacer material layer deposited on the sidewalls of the bottom sacrificial feature 203. The lack of the inner spacer features 230 covering the sidewalls of the bottom sacrificial feature 203 facilitates the replacement operations at block 122.

Referring to FIGS. 1, 8A, 8B, 9, 10A, and 10B, method 100 includes a block 122 where the bottom sacrificial feature 203 is replaced with a bottom dielectric feature 234. For purpose of the present disclosure, replacing a layer may mean either removing the layer and deposit a replacement layer in place of the removed layer or chemically converting the layer into a layer of different electrical property. The replacement operations at block 122 of method 100 are more aligned with the former and the oxidation operations at block 322 of method 300 are more aligned with the latter. Referring to FIG. 8A, operations at block 122 may start with selectively removal of the bottom sacrificial features 203. In embodiments where the bottom sacrificial features 203 are formed of silicon germanium, the selective removal of the bottom sacrificial features 203 may be similar to the selective etch of the sacrificial layers 206. It is noted that at block 122, the sacrificial layers 206 are covered and protected by the inner spacer features 230 and the bottom capping features 205, each of which prevents the selective etch at block 122 from damaging the sacrificial layers 206. FIG. 8A also demonstrates the primary function of the bottom capping feature 205, which is to isolate the bottommost sacrificial layer 206 from the to-be-removed bottom sacrificial features 203. While the selective removal of the bottom sacrificial feature 203 at block 122 may not completely remove the bottom capping feature 205, it may reduce its thickness, which may facilitate complete removal of the bottom capping feature 205 at block 132. After the removal of the bottom sacrificial features 203, bottom vacancies 232 are formed.

Figure 9:
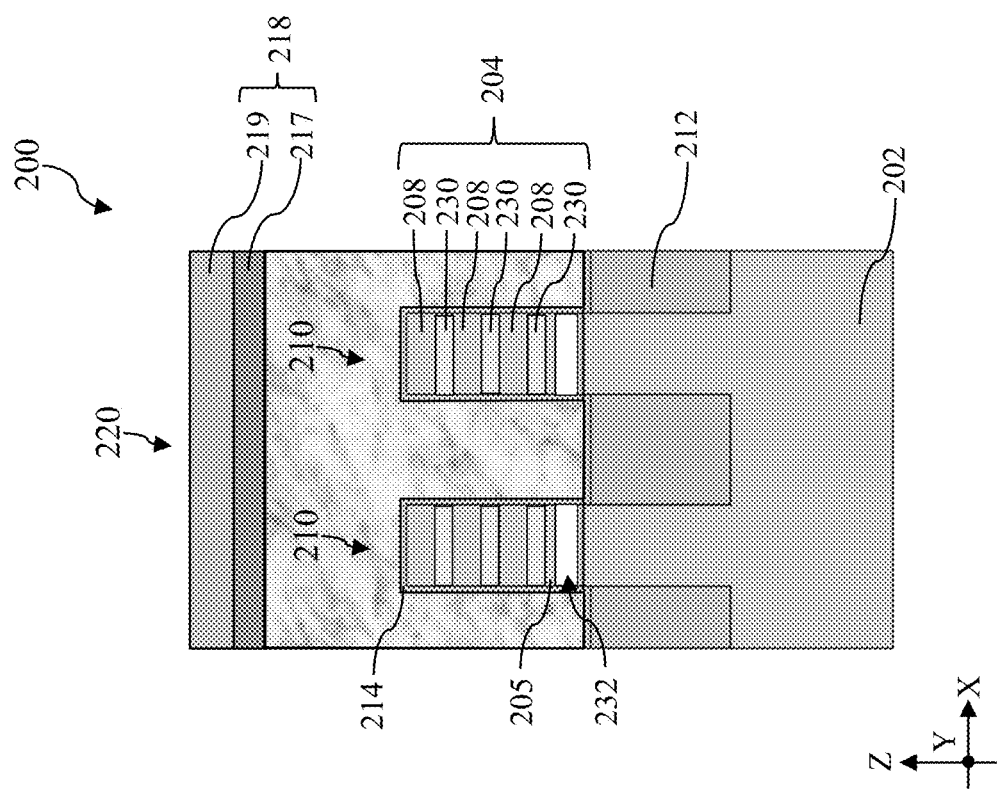

At block 122 of method 100, the dummy gate stack 220 maintains structural integrity when the bottom sacrificial features 203 are removed. FIG. 9 is a fragmentary cross-sectional view of the workpiece 200 along the lengthwise direction (Y direction) of the fin-shaped structures 210 near the boundary between a source/drain region 20 and a channel region 10. When viewed from a source/drain recess 226, sidewalls of the channel layers 208 are exposed and sidewalls of the sacrificial layers 206 are capped by inner spacer features 230. The dummy gate stack 220 wraps at least partially around the fin-shaped structures 210 and is supported by the isolation feature 212. As such, when bottom sacrificial features 203 are removed to form the bottom vacancies 232, the structural integrity of the structure shown in FIG. 8A may be maintained.

A dielectric material is then deposited over the workpiece 200, including into the bottom vacancies 232, using a deposition process with good hole-filling capability. In some embodiments, the dielectric material may include silicon oxide, silicon nitride, silicon oxycarbide, silicon oxycarbonitride, or a suitable dielectric material. The deposition process here may be an atomic layer deposition (ALD) process. After the deposition of the dielectric material, an isotropic and selective etch process may be performed to remove dielectric material outside the bottom vacancies 232, thereby forming bottom dielectric features 234. Despite the good hole-filling capability of the ALD process, a seam 236 may be present in the bottom dielectric feature 234. The seam 236 is a sheet-like air gap or void that extends substantially on the X-Y plane. In some instances, the seam 236 may have a thickness (i.e., a dimension along the Z direction) between 0.1 nm and about 1.5 nm. In some examples, seams may be missing from the bottom dielectric features 234. In some implementations, the dielectric material for the bottom dielectric features 234 may be selected such that the isotropic process is highly selective such that the substrate 202, the channel layers 208, and the inner spacer features 230 are not damaged by the isotropic etch process at block 122.

Figures 11A, 11B:
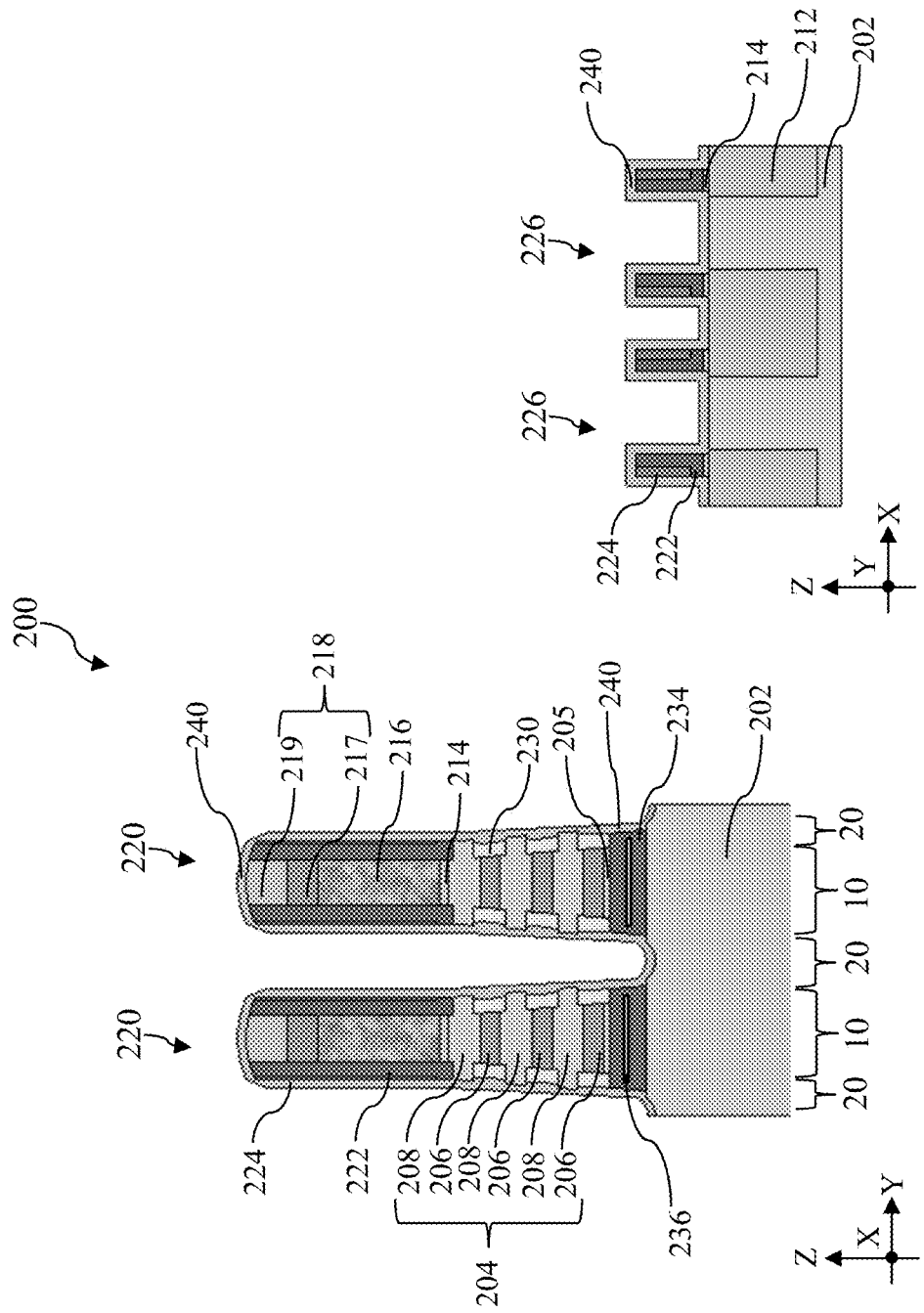

Referring to FIGS. 1, 11A and 11B, method 100 includes a block 124 where a liner 240 over the workpiece 200. In some embodiments, the liner 240 may include silicon oxide or silicon oxycarbide. The liner 240 may be conformally deposited over the workpiece 200 using CVD, ALD, or a suitable deposition technique. In some instances, the liner 240 may be formed to a thickness between 3 nm and about 5 nm.

Figures 12A, 12B:
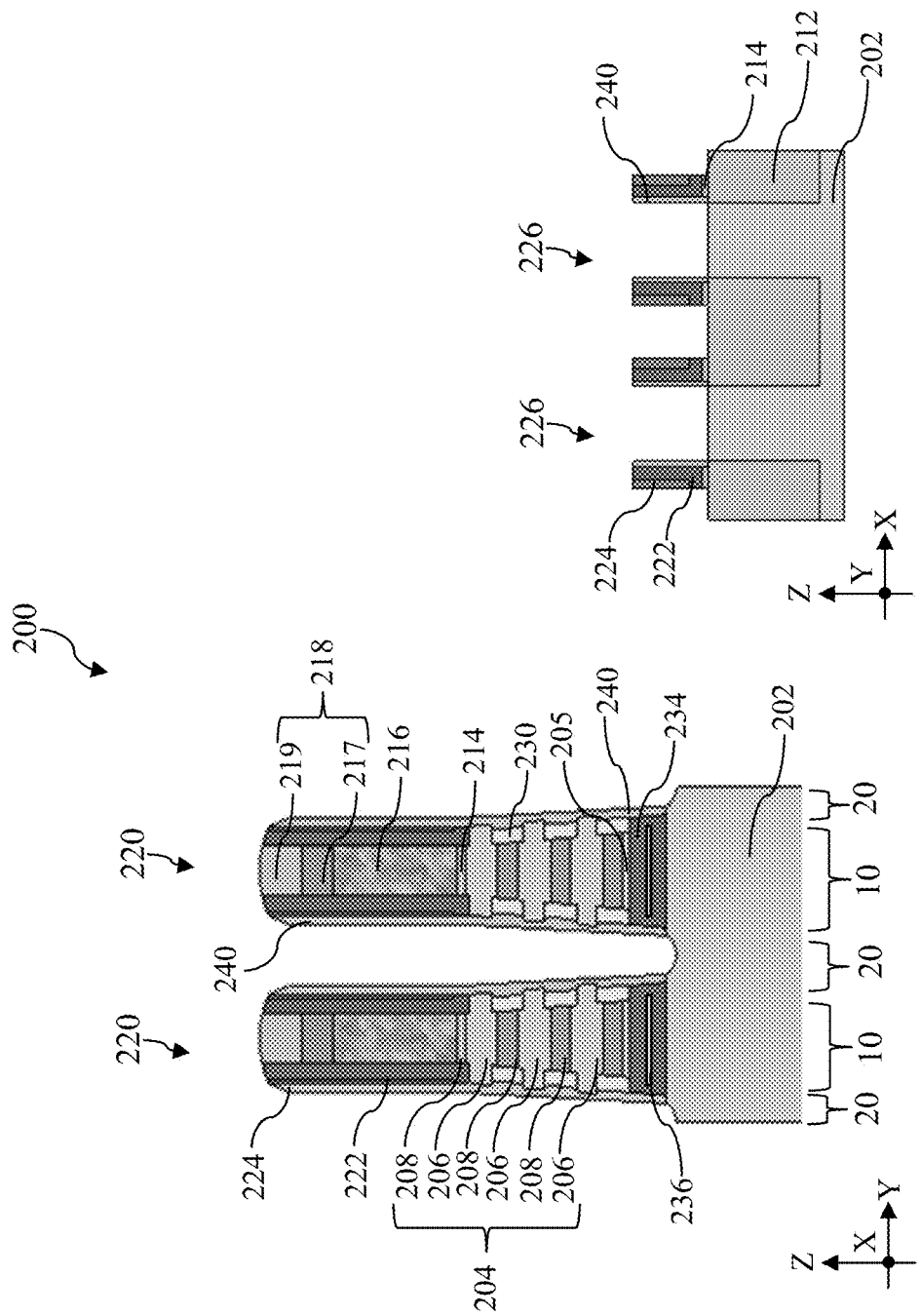

Referring to FIGS. 1, 12A and 12B, method 100 includes a block 126 where the liner 240 is etched back to expose the substrate 202. To facilitate the deposition of the first epitaxial feature 242 at block 128, the liner 240 is anisotropically etched to remove portions of the liner 240 from top-facing surfaces, such as the top surfaces of the source/drain region 20 of the fin-shaped structures 210 (shown in FIG. 12A), the top surfaces of the dummy gate stacks 220 (shown in FIG. 12A), top surfaces of the first spacer layer 222 and second spacer layer 224 (shown in FIG. 12B), top surfaces of the isolation features 212 (shown in FIG. 12B). In some embodiments, the anisotropic etch at block 126 may include a dry etch process. In some instances, after the etch back at block 126, the remaining liner 240 may have a thickness between about 1 nm and about 2 nm.

Referring to FIGS. 1, 13A and 13B, method 100 includes a block 128 where a first epitaxial feature 242 is deposited on the exposed portion of the substrate 202. The first epitaxial feature 242 may be epitaxially and selectively formed from the exposed top surfaces of the substrate 202. Precisely speaking, as shown in FIG. 13B, the exposed portion of the substrate 202 is the portion that was the bottom portion of the fin-shaped structure 210 in the source/drain region 20. Because surfaces of the liner 240 are not conducive to epitaxial deposition of the first epitaxial feature 242, the first epitaxial feature 242 is formed in a bottom-up fashion from the exposed surface of the substrate 202. In some implementations, the first epitaxial feature 242 may be formed of silicon, silicon germanium, or arsenic-doped silicon (i.e., silicon arsenide). When an n-type device is desired, the first epitaxial feature 242 may be formed of silicon or arsenic doped silicon. When a p-type device is desired, the first epitaxial feature 242 may be formed of silicon germanium. In the embodiment depicted in FIG. 13A, the first epitaxial feature 242 is formed of silicon. Suitable epitaxial processes for block 128 include an MBE process, a VPE process, an UHV-CVD process, an MOCVD process, and/or other suitable epitaxial growth processes.

In some embodiments, the first epitaxial layer 242 has, along the Z direction, a thickness between about 15 nm and about 30 nm, measured from the source/drain region 20. Put differently, a top surface of the first epitaxial feature 242 is higher than (i.e., further away from the substrate 202 along the Z direction) a top surface of the bottom dielectric feature 234 and a top surface of the bottom capping feature 205. The first epitaxial feature 242 serves several functions. For example, because first epitaxial feature 242 is either undoped or doped with a dopant with smaller diffusivity (e.g., arsenic (As)), the first epitaxial feature 242 does not serve any source/drain functions and act more like a diffusion barrier preventing dopants in the second epitaxial features 244 (to be described below) from diffusing downwards. For another example, the first epitaxial feature 242 presents a raised crystalline floor for the benefit of formation of the second epitaxial features 244. Without the first epitaxial feature 242, the second epitaxial feature 244 would have to be formed all the way from the source/drain region 20 to at least the top surface level of the topmost channel layer 208. That is, without the first epitaxial feature 242, a satisfactory second epitaxial feature 244 would have a large aspect ratio, which may result in reduced process windows and an increased amount of defects.

Referring to FIGS. 1, 14A and 14B, method 100 includes a block 130 where a second epitaxial feature 244 is deposited over the first epitaxial feature 242. After the deposition of the first epitaxial feature 242, a pre-clean process, such as a chemical oxide removal process, may be performed to remove portions of the liner 240 that is not covered by the first epitaxial feature 242. An example chemical oxide removal process may include a dry etch process using hydrogen fluoride (HF) and ammonia ($NH_3$). After byproducts of the chemical oxide removal process are removed by sublimation, the second epitaxial feature 244 may be deposited using an MBE process, a VPE process, an UHV-CVD process, an MOCVD process. The second epitaxial feature 244 may be doped in-situ. In embodiments represented in FIGS. 14A and 14B, the second epitaxial feature 244 include silicon germanium doped with a p-type dopant, such as boron (B). In some implementations, the deposition of the second epitaxial feature 244 is selective to semiconductor surfaces. In the example depicted in FIGS. 14A and 14B, the second epitaxial feature 244 are deposited or grown from the top surface of the first epitaxial feature 242 and exposed sidewalls of the channel layers 208. Although deposition of the second epitaxial feature 244 on the liner 240, the inner spacer features 230, and the second spacer layer 224 is suppressed, overgrowth of the second epitaxial feature 244 may merge and eventually cover their surfaces or portions thereof, as shown in FIG. 14A. In some embodiments, operations at block 128 and block 130 may be performed in the same process chamber without breaking vacuum. To activate the dopants in the second epitaxial feature 244, block 130 may include an anneal process to anneal the second epitaxial feature 244. In some implementation, the anneal process may include a rapid thermal anneal (RTA) process, a laser spike anneal process, a flash anneal process, or a furnace anneal process. In some instances, the anneal process includes a peak anneal temperature between about 900° C. and about 1100° C.

Figure 15:
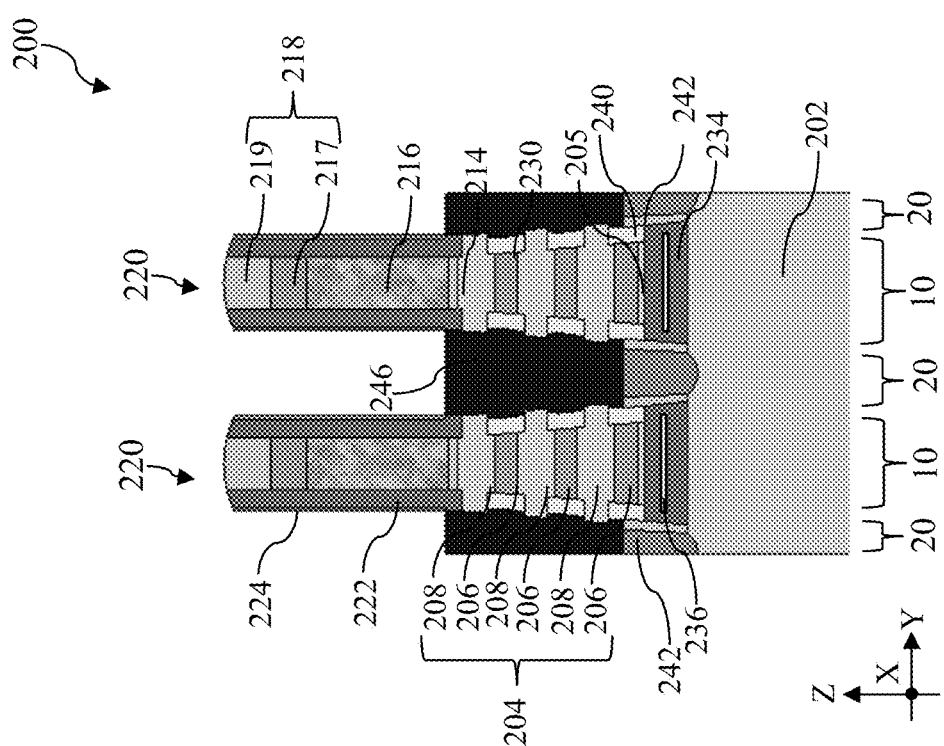

FIG. 15 illustrates a fragmentary cross-sectional view of a workpiece 200 in an n-type device region. In FIG. 15, an n-type third epitaxial feature 246, instead of the p-type second epitaxial feature 244, may be formed in an n-type device region. In some embodiments, the third epitaxial feature 246 includes silicon that is doped in-situ with an n-type dopant, such as phosphorus (P). Due to the similarities in the processes, detailed descriptions for formation of the third epitaxial feature 246 will not be repeated.

Figure 16:
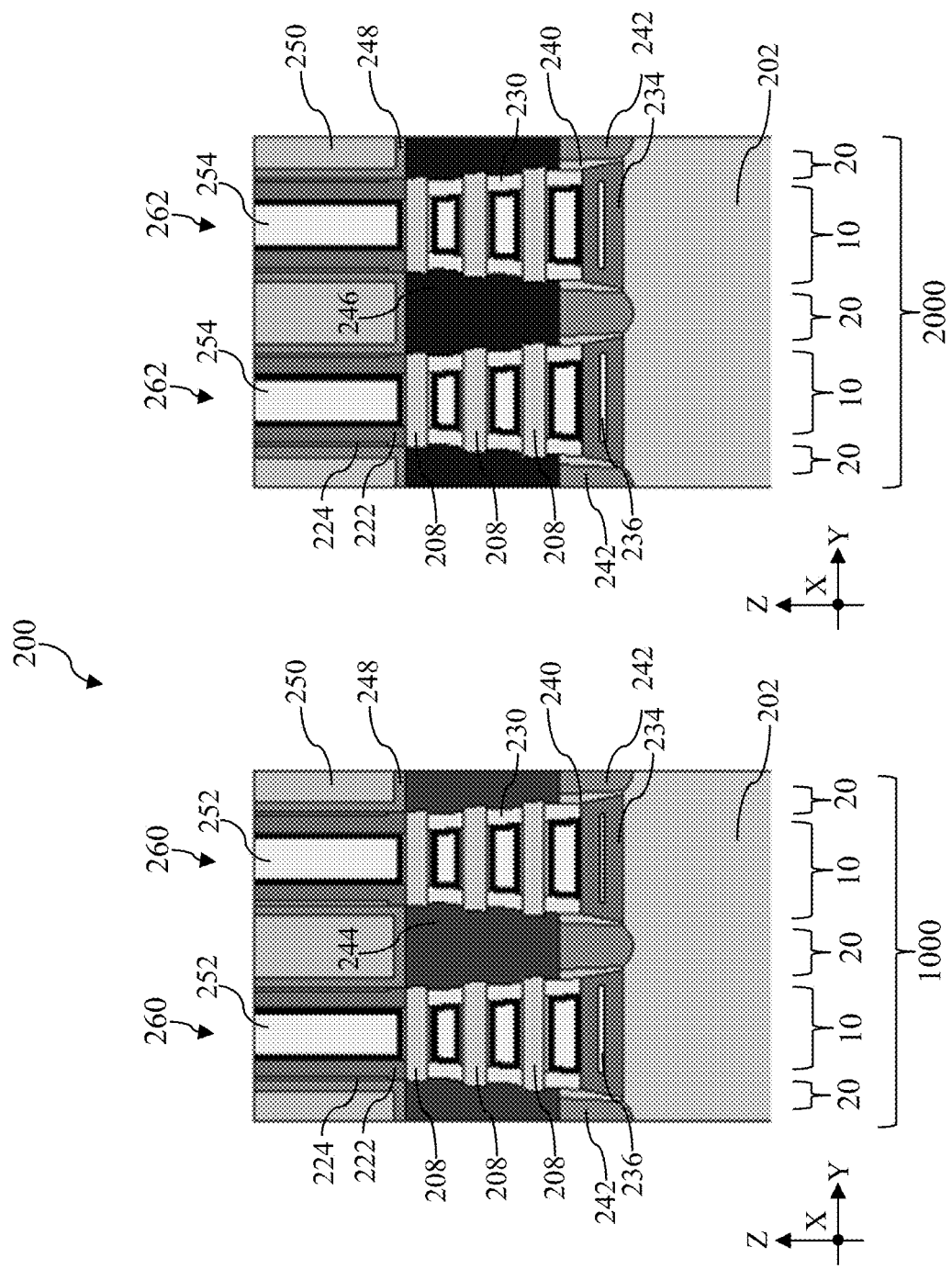
Figure 17:
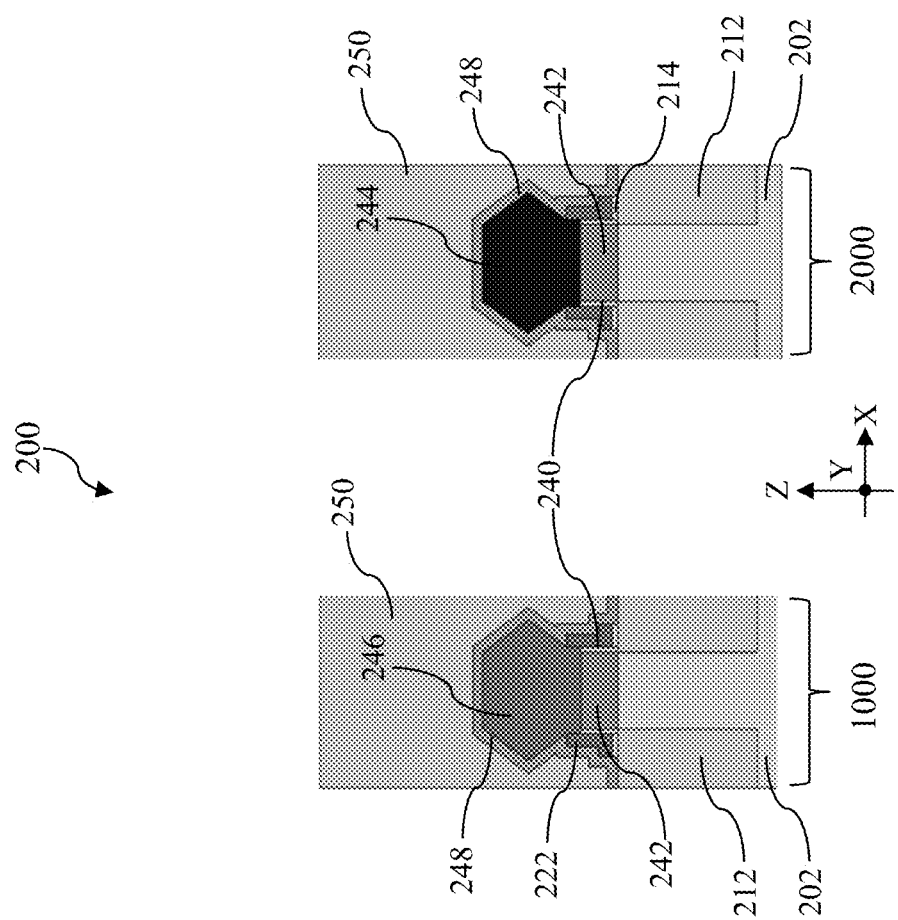

Referring to FIGS. 1, 16 and 17, method 100 includes a block 132 where the dummy gate stack 220 is replaced with a gate structure. Operations at block 132 may include formation of an contact etch stop layer (CESL) 248, deposition of an interlayer dielectric (ILD) layer 250 over the CESL 248, a planarization process to expose the dummy electrode layer 216, removal of the dummy gate stack 220, selective removal of the sacrificial layers 206 to release the channel layers 208 as channel members 208, and deposition of the gate structure. Referring now to FIGS. 16 and 17, the CESL 248 is formed prior to forming the ILD layer 250. In some examples, the CESL 248 may include silicon nitride, silicon oxide, silicon oxynitride, and/or other materials known in the art. The CESL 248 may be formed by ALD, plasma-enhanced chemical vapor deposition (PECVD) process and/or other suitable deposition or oxidation processes. The ILD layer 250 is then deposited over the CESL 248. In some embodiments, the ILD layer 250 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 250 may be deposited by a PECVD process or other suitable deposition technique. In some embodiments, after formation of the ILD layer 250, the workpiece 200 may be annealed to improve integrity of the ILD layer 250.

Referring still to FIGS. 16 and 17, after the deposition of the CESL 248 and the ILD layer 250, the workpiece 200 may be planarized by a planarization process to expose the dummy electrode layer 216. For example, the planarization process may include a CMP process. Exposure of the dummy electrode layer 216 allows the removal of the dummy electrode layer 216, removal of the dummy dielectric layer 214, and release of the channel layers 208. In some embodiments, the removal of the dummy electrode layer 216 and the dummy dielectric layer 214 results in a gate trench over the channel regions 10. The removal of the dummy electrode layer 216 and the dummy dielectric layer 214 may include one or more etching processes that are selective to the material in the dummy electrode layer 216 and the dummy dielectric layer 214. For example, the removal of the dummy electrode layer 216 and the dummy dielectric layer 214 may be performed using as a selective wet etch, a selective dry etch, or a combination thereof that is selective to the dummy electrode layer 216 and the dummy dielectric layer 214. After the selective removal of the dummy electrode layer 216 and the dummy dielectric layer 214, surfaces of the channel layers 208 and the sacrificial layers 206 in the channel regions 10 are exposed in the gate trench. Then the sacrificial layers 206 are selectively removed to release the channel layers 208 as channel members 208. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx is removed by an etchant such as $NH_4OH$. In some embodiments represented in FIG. 16, the remaining bottom capping feature 205 (shown in FIGS. 14A and 15) is rather thin and may be removed along with the sacrificial layers 206.

In some embodiments illustrated in FIGS. 16 and 17, the semiconductor device 200 or the workpiece 200 includes a first device region 1000 and a second device region 2000. In the embodiment depicted in FIGS. 16 and 17, the first device region 1000 is a p-type device region and the second device region 2000 is an n-type device region. The p-type second epitaxial feature 244 is formed in the first device region 1000. The n-type third epitaxial feature 246 is formed in the second device region 2000. After the channel members 208 are released, first gate structures 252 are formed in the first device region 1000 and the second gate structure 254 are formed in the second device region 2000. Each of the first gate structure 252 and the second gate structure 254 wraps around each of the channel members 208, which are formed from the channel layers 208. Each of the first gate structure 252 and the second gate structure 254 may be a high-K metal gate structure. Here, a high-k dielectric material refers to a dielectric material with a dielectric constant greater than that of silicon dioxide, which is about 3.9. In various embodiments, each of the first gate structure 252 and the second gate structure 254 includes an interfacial layer, a high-K gate dielectric layer formed over the interfacial layer, and/or a gate electrode layer formed over the high-K gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide. Alternatively, the high-K gate dielectric layer may include other high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer may be formed by ALD, PVD, CVD, e-beam evaporation, or other suitable process. In some embodiments, the first gate structure 252 and the second gate structure 254 may have different compositions and may be formed separately. For example, the first gate structure 252 may include p-type work function metal layers while the second gate structure 254 may include n-type work function metal layers. In various embodiments, a CMP process may be performed to remove excessive metal from the workpiece 200, thereby providing substantially planar top surfaces of the first gate structure 252 and the second gate structure 254.

Upon conclusion of the operations at block 132, p-type MBC transistors 260 and n-type MBC transistors 262 are substantially formed in the first device region 1000 and the second device region 2000, respectively. As shown in FIG. 16, in the first device region 1000, the first gate structure 252 wraps around each of the channel members 208 in the channel region 10. A bottommost surface of the first gate structure 252 is disposed on the bottom dielectric feature 234, which may include the seam 236. The bottom dielectric feature 234 is spaced apart from the first epitaxial feature 242 by the liner 240. Put differently, two adjacent bottom dielectric features 234 sandwich a first epitaxial feature 242. Each of the first epitaxial feature 242 is spaced apart from the bottom dielectric feature 234 by the liner 240. The second epitaxial feature 244 is disposed on the top surface of the first epitaxial feature 242. The second epitaxial feature 244 is in contact with sidewalls of the channel members 208.

Referring to FIG. 1, method 100 includes a block 134 where further processes are performed. Such further processes may include deposition of a gate capping layer, deposition of a further ILD layer over the gate capping layer, formation of gate contacts, formation of source/drain contacts, and formation of further interconnect structures. As the compositions and formation processes of the gate capping layer and the further ILD layer may be similar to those of the CESL 248 and the ILD layer 250, detailed descriptions of the gate capping layer and the further ILD layer are omitted for brevity.

Method 300 in FIG. 18 will now be described in conjunction with fragmentary cross-sectional view of a workpiece 200 in FIGS. 19, 20, 21A, 21B, 22A, 22B, 23A, 23B, 24A, 24B, 25A, 25B, 26A, 26B, 27A, 27B, 28A, 28B, 29A, 29B, 30, 31, and 32. It is noted that, throughout the present disclosure, similar features may share similar reference numerals. Unless otherwise specified, features having the same reference numeral may share substantially the same formation processes and materials.

Figure 19:
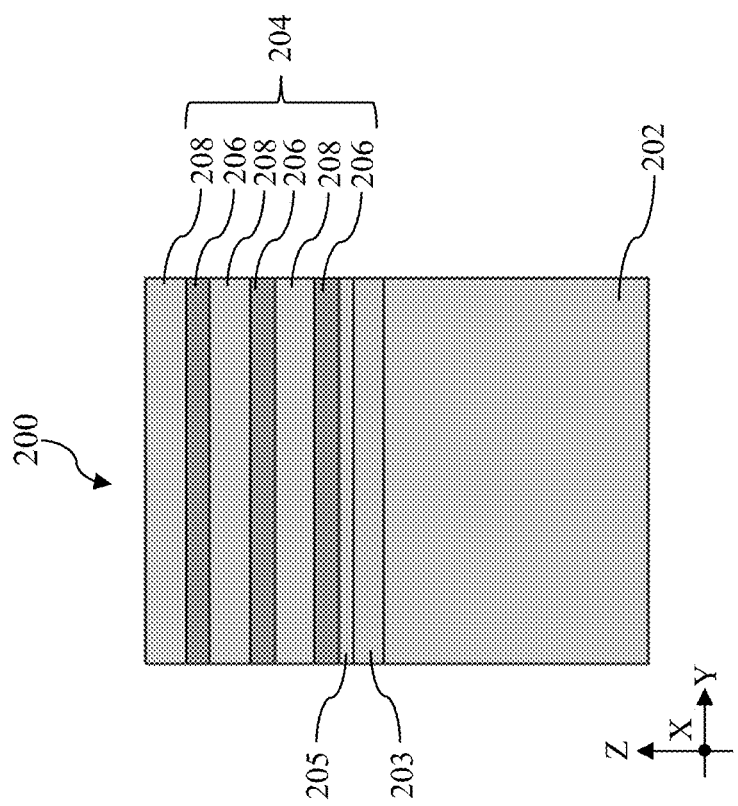

Referring to FIGS. 18 and 19, method 300 includes a block 302 where a bottom sacrificial layer 203 is deposited on a substrate 202 of a workpiece 200. Because operations and device structures at block 302 are substantially similar to those at block 102 of method 100, detailed description of block 302 is omitted for brevity.

Referring to FIGS. 18 and 19, method 300 includes a block 304 where a bottom capping feature 205 is deposited on the bottom sacrificial layer 203. Because operations and device structures at block 304 are substantially similar to those at block 104 of method 100, detailed description of block 304 is omitted for brevity.

Referring to FIGS. 18 and 19, method 300 includes a block 306 where a stack 204 of sacrificial layers 206 and channel layers 208 is deposited on the bottom capping feature 205. Because operations and device structures at block 306 are substantially similar to those at block 106 of method 100, detailed description of block 306 is omitted for brevity.

Figure 20:
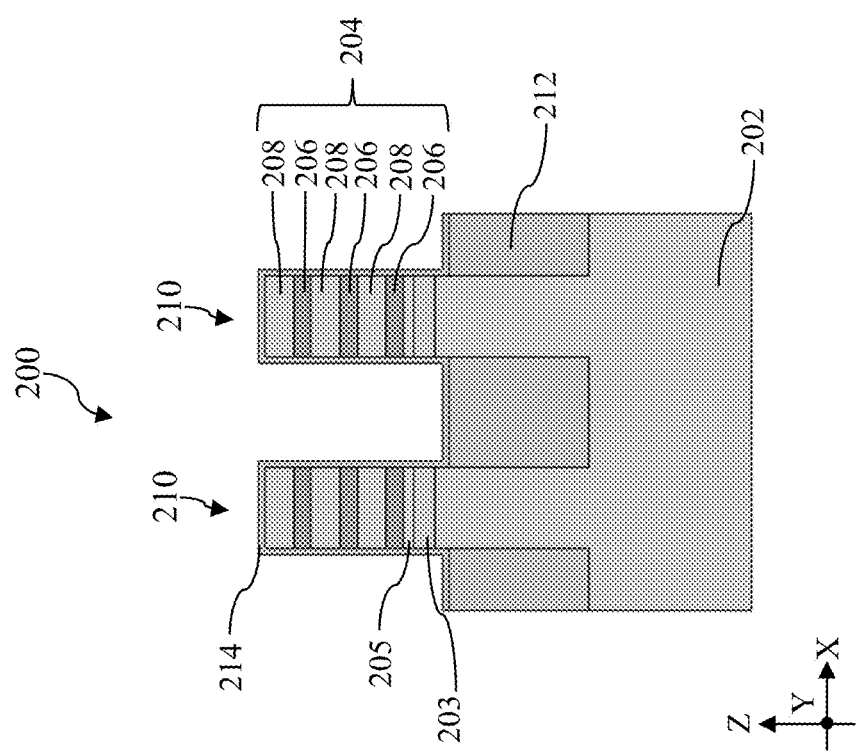

Referring to FIGS. 18 and 20, method 300 includes a block 308 where fin-shaped structures 210 are formed from the stack 204, the bottom capping feature 205, the bottom sacrificial layer 203, and the substrate 202. Because operations and device structures at block 308 are substantially similar to those at block 108 of method 100, detailed description of block 308 is omitted for brevity.

Referring to FIGS. 18 and 20, method 300 includes a block 310 where an isolation feature 212 between the fin-shaped structures 210. Because operations and device structures at block 310 are substantially similar to those at block 110 of method 100, detailed description of block 310 is omitted for brevity.

Referring to FIGS. 18, 20, 21A, and 21B, method 100 includes a block 312 where a dummy gate stack 220 is formed over the fin-shaped structures 210. Because operations and device structures at block 312 are substantially similar to those at block 112 of method 100, detailed description of block 312 is omitted for brevity.

Referring to FIGS. 18, 21A and 21B, method 300 includes a block 314 where a gate spacer layer 223 is deposited over the workpiece 200. Because operations and device structures at block 314 are substantially similar to those at block 114 of method 100, detailed description of block 314 is omitted for brevity.

Figures 22A, 22B:
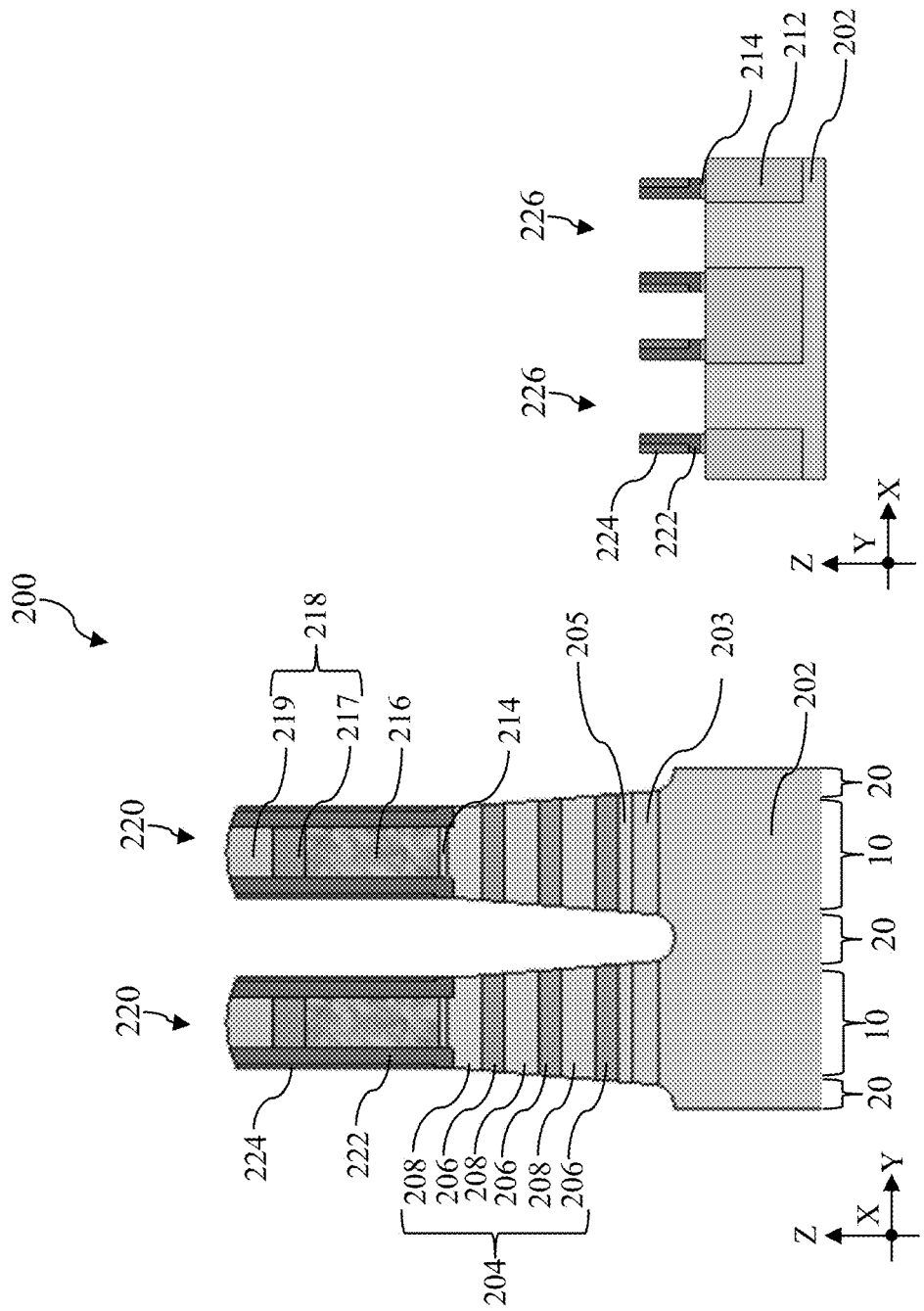

Referring to FIGS. 18, 22A and 22B, method 300 includes a block 316 where source/drain regions 20 of the fin-shaped structures 210 are recessed. Because operations and device structures at block 316 are substantially similar to those at block 116 of method 100, detailed description of block 316 is omitted for brevity.

Figures 23A, 23B:
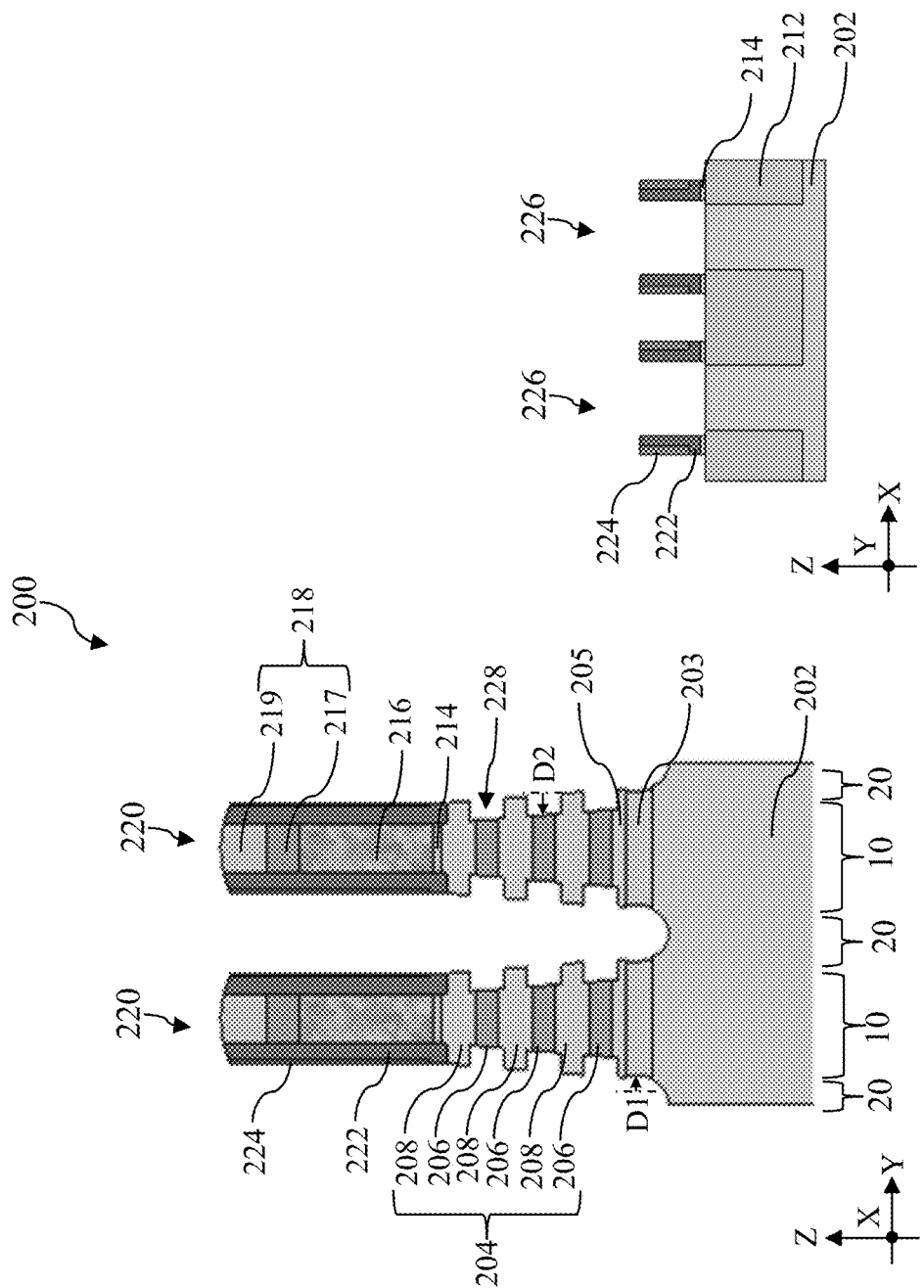

Referring to FIGS. 18, 23A and 23B, method 300 includes a block 318 where the sacrificial layers 206 are selectively and partially etched to form inner spacer recesses 228. Because operations and device structures at block 318 are substantially similar to those at block 118 of method 100, detailed description of block 318 is omitted for brevity.

Figures 24A, 24B:
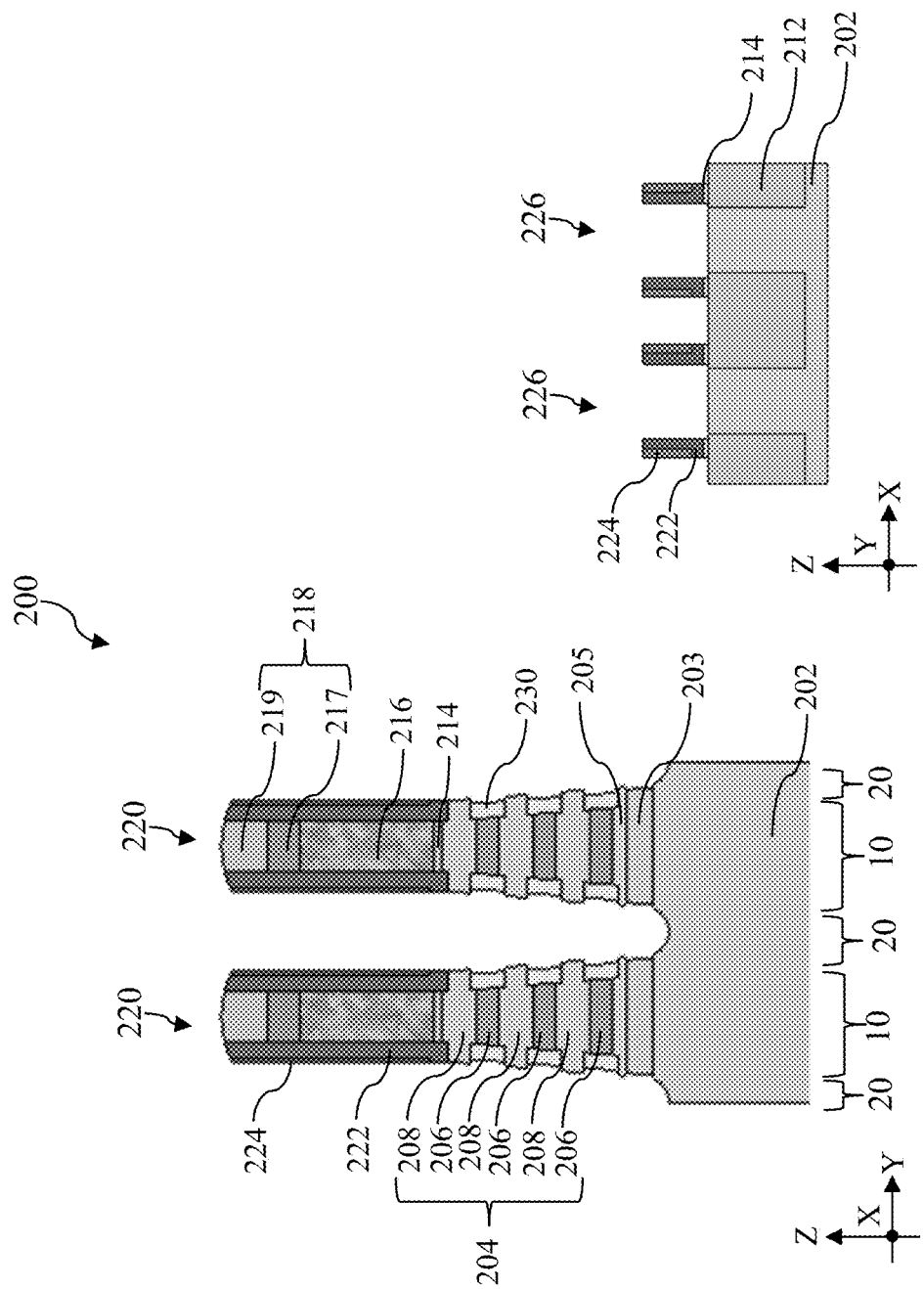

Referring to FIGS. 18, 24A and 24B, method 300 includes a block 320 where inner spacer features 230 are formed in the inner spacer recesses 228. Because operations and device structures at block 320 are substantially similar to those at block 120 of method 100, detailed description of block 320 is omitted for brevity.

Figures 25A, 25B:
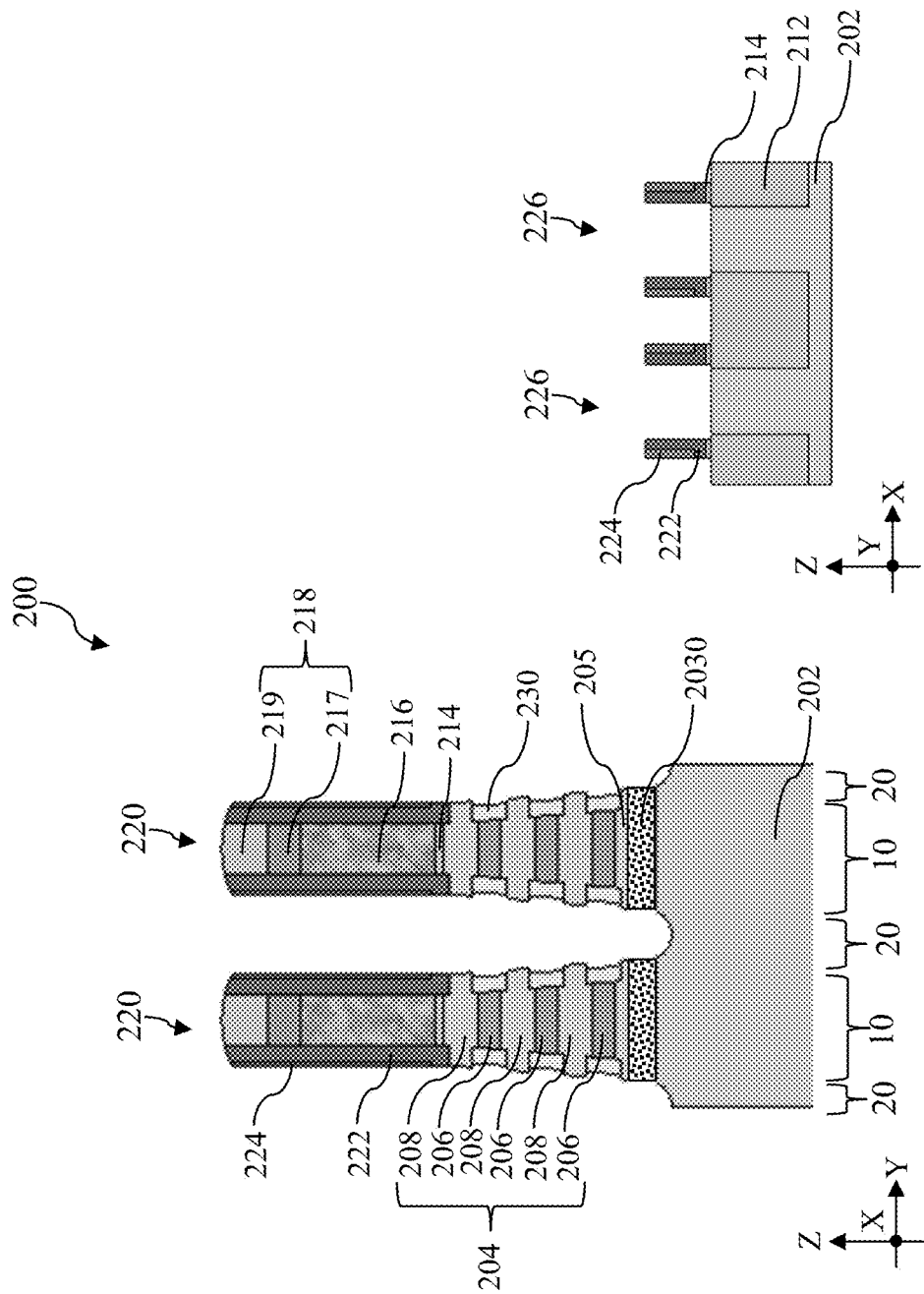

Referring to FIGS. 18, 25A and 25B, method 300 includes a block 322 where the bottom sacrificial feature 203 is oxidized to form a bottom oxide feature 2030. Different from the operations at block 122 of method 100, the bottom sacrificial feature 203 is not removed at block 322. Instead, the bottom sacrificial feature 203 is oxidized to transform into bottom oxide feature 2030. In some embodiments, the oxidation of the bottom sacrificial feature 203 at block 320 may be performed by use of an oxidizing agent, such as oxygen ($O_2$), water ($H_2O$), hydrogen peroxide ($H_2O_2$), or ozone ($O_3$). In some the foregoing embodiments, a plasma form of the oxidizing agents may be used. For example, an oxygen plasma, a water plasma, hydrogen peroxide plasma, ozone plasma, or a combination thereof. In one embodiment, the oxidation at block 322 may be performed using ozone. In embodiments where the bottom sacrificial features 203 are formed of silicon germanium, the bottom oxide feature 2030 may be formed of silicon germanium oxide or may include silicon oxide and germanium oxide. As silicon germanium oxide, silicon oxide, and germanium oxide are dielectric materials, the bottom oxide feature 2030 functions in a similar manner as does the bottom dielectric feature 234, both of which are dielectric features underlying the stack 204. Here, because the bottom sacrificial feature 203 is transformed into the bottom oxide feature 2030, it can be said that the bottom sacrificial feature 203 is replaced by the bottom oxide feature 2030. It is noted that at block 322, the sacrificial layers 206 are covered and protected by the inner spacer features 230 and the bottom capping features 205, each of which prevents the oxidizing agent(s) from oxidizing the sacrificial layers 206. FIG. 25A also demonstrates the primary function of the bottom capping feature 205, which is to isolate the bottommost sacrificial layer 206 from the to-be-oxidized bottom sacrificial features 203. Without the bottom capping feature 205, the bottommost sacrificial layer 206 would be oxidized, creating process variables for subsequent processes, such as the removal of the sacrificial layers 206.

Referring to FIGS. 18, 26A and 26B, method 300 includes a block 324 where a liner 240 over the workpiece 200. Because operations and device structures at block 324 are substantially similar to those at block 124 of method 100, detailed description of block 324 is omitted for brevity.

Figures 27A, 27B:
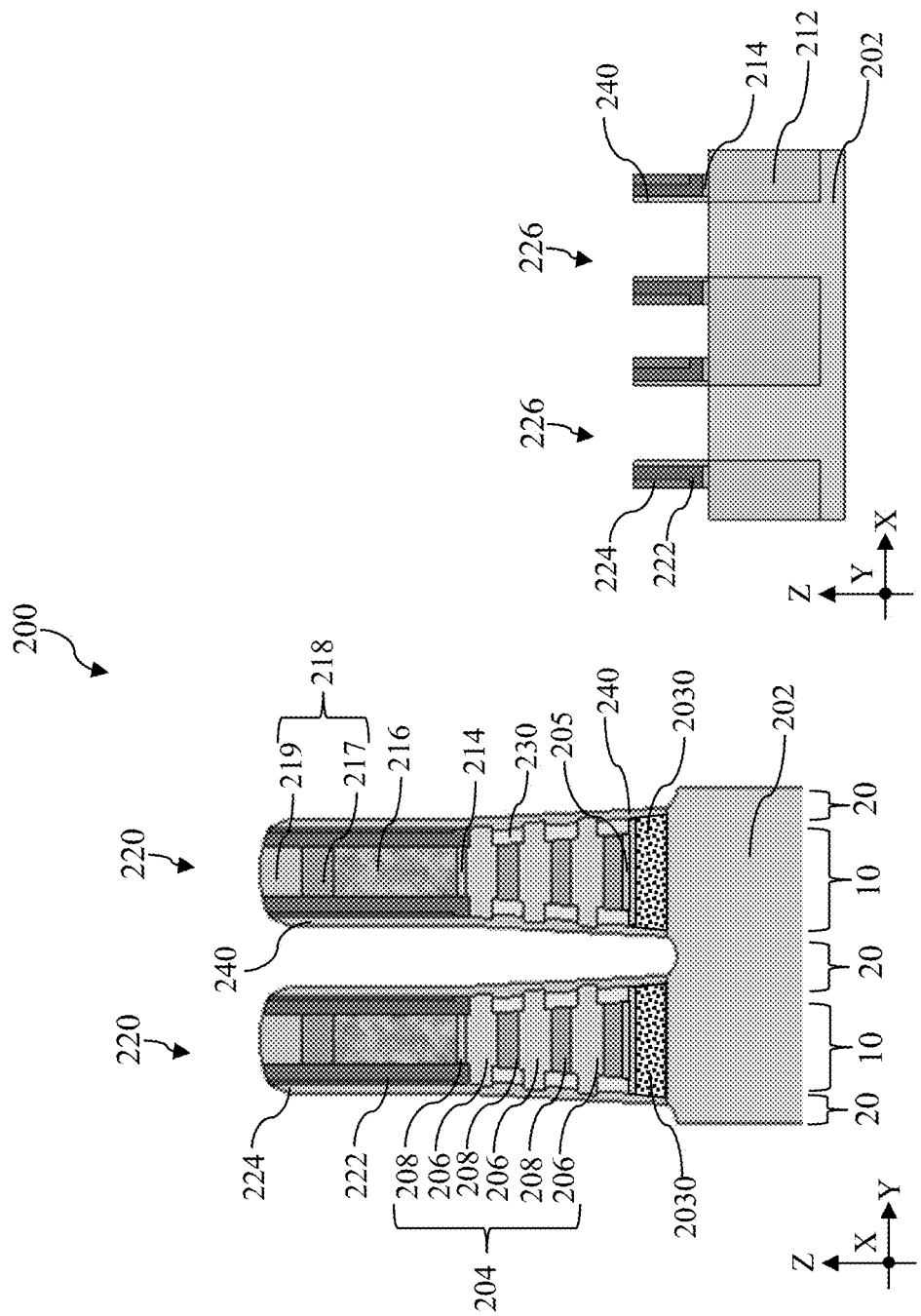

Referring to FIGS. 18, 27A and 27B, method 300 includes a block 326 where the liner 240 is etched back to expose the substrate 202. Because operations and device structures at block 326 are substantially similar to those at block 126 of method 100, detailed description of block 326 is omitted for brevity.

Referring to FIGS. 18, 28A and 28B, method 300 includes a block 328 where a first epitaxial feature 242 is deposited on the exposed portion of the substrate 202. The first epitaxial feature 242 may be epitaxially and selectively formed from the exposed top surfaces of the substrate 202. Precisely speaking, as shown in FIG. 28B, the exposed portion of the substrate 202 is the portion that was the bottom portion of the fin-shaped structure 210 in the source/drain region 20. Because surfaces of the liner 240 are not conducive to epitaxial deposition of the first epitaxial feature 242, the first epitaxial feature 242 is formed in a bottom-up fashion from the exposed surface of the substrate 202. In some implementations, the first epitaxial feature 242 may be formed of silicon, silicon germanium, or arsenic-doped silicon (i.e., silicon arsenide). When an n-type device is desired, the first epitaxial feature 242 may be formed of silicon or arsenic doped silicon. When a p-type device is desired, the first epitaxial feature 242 may be formed of silicon germanium. In the embodiment depicted in FIGS. 28A and 28B, the first epitaxial feature 242 is formed of silicon. Suitable epitaxial processes for block 328 include an MBE process, a VPE process, an UHV-CVD process, an MOCVD process, and/or other suitable epitaxial growth processes.

In some embodiments, the first epitaxial layer 242 has, along the Z direction, a thickness between about 15 nm and about 30, measured from the source/drain region 20. Put differently, a top surface of the first epitaxial feature 242 is higher than (i.e., further away from the substrate 202 along the Z direction) a top surface of the bottom oxide feature 2030 and a top surface of the bottom capping feature 205. The first epitaxial feature 242 serves several functions. For example, because first epitaxial feature 242 is either undoped or doped with a dopant with smaller diffusivity (e.g., arsenic (As)), the first epitaxial feature 242 does not serve any source/drain functions and act more like a diffusion barrier preventing dopants in the second epitaxial features 244 (to be described below) from diffusing downwards. For another example, the first epitaxial feature 242 presents a raised crystalline floor for the benefit of formation of the second epitaxial features 244. Without the first epitaxial feature 242, the second epitaxial feature 244 would have to be formed all the way from the source/drain region 20 to at least the top surface level of the topmost channel layer 208. That is, without the first epitaxial feature 242, a satisfactory second epitaxial feature 244 would have a large aspect ratio, which may result in reduced process windows and an increased amount of defects.

Figures 29A, 29B:
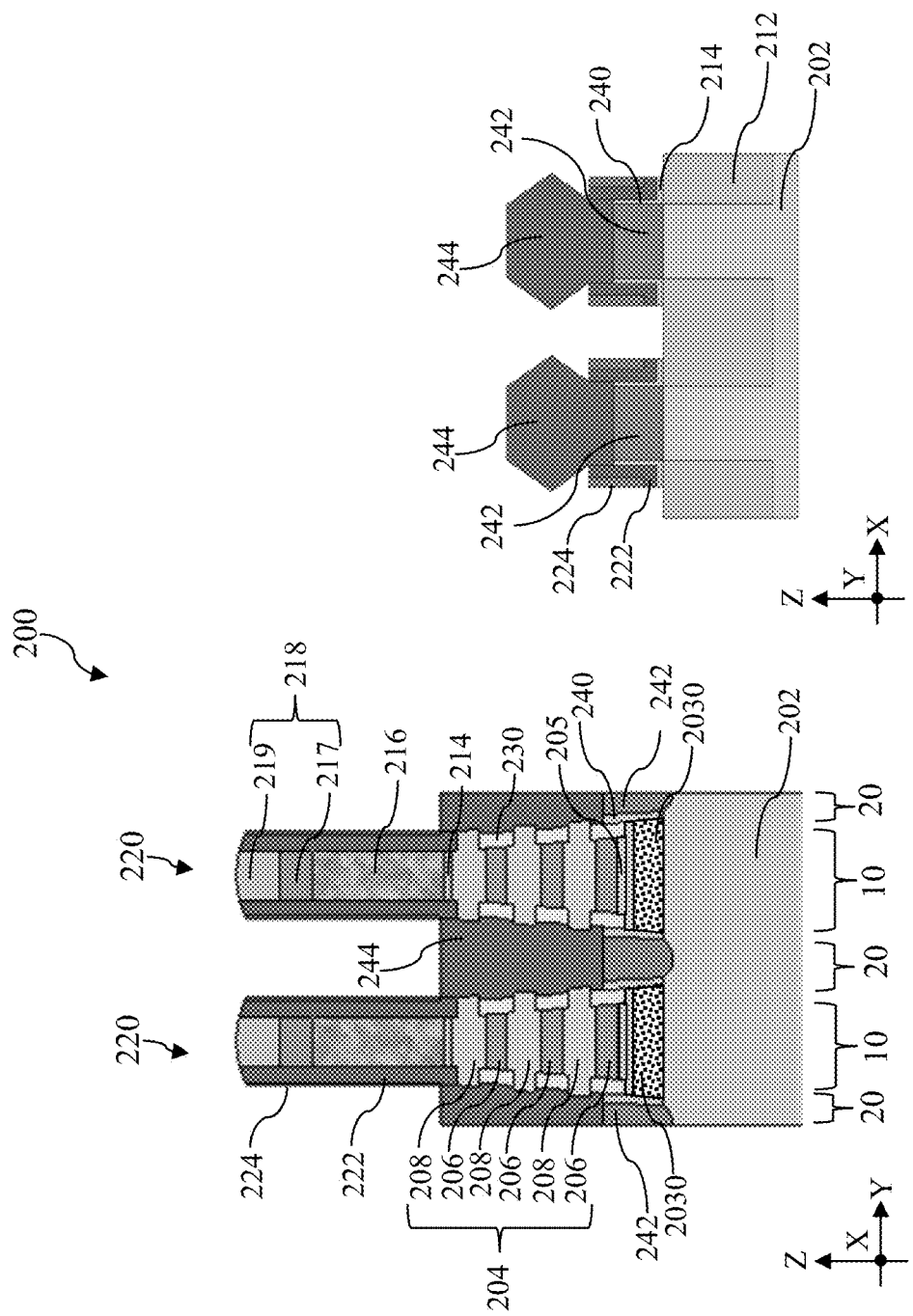

Referring to FIGS. 18, 29A and 29B, method 300 includes a block 330 where a second epitaxial feature 244 is deposited over the first epitaxial feature 242. Because operations and device structures at block 330 are substantially similar to those at block 130 of method 100, detailed description of block 330 is omitted for brevity.

Figure 30:
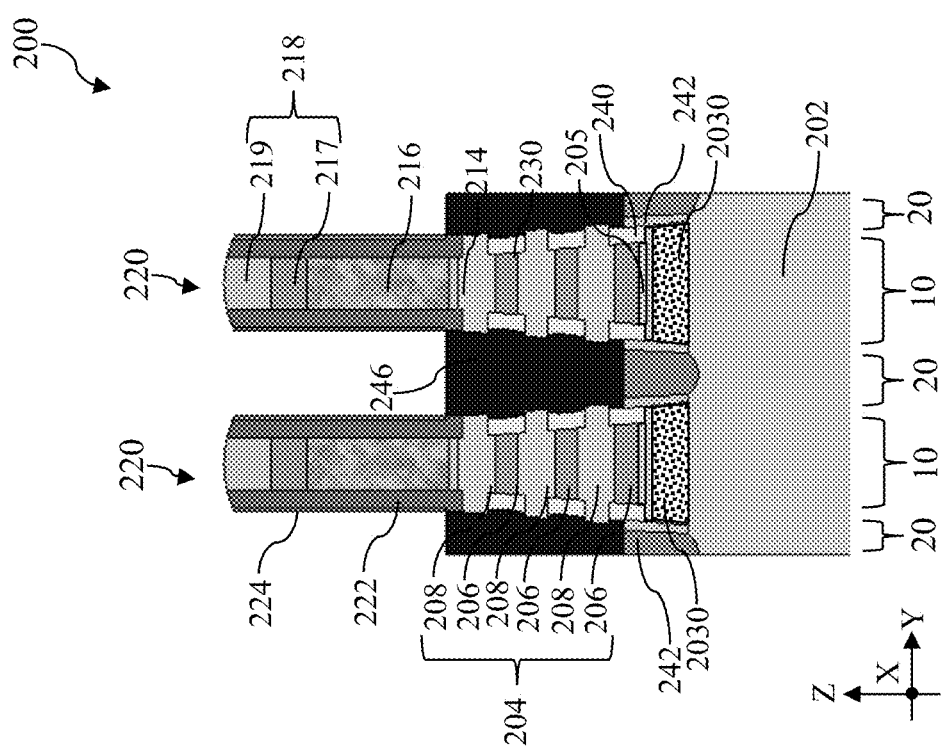

FIG. 30 illustrates a fragmentary cross-sectional view of a workpiece 200 in an n-type device region. In FIG. 30, an n-type third epitaxial feature 246, instead of the p-type second epitaxial feature 244, may be formed in an n-type device region. In some embodiments, the third epitaxial feature 246 includes silicon that is doped in-situ with an n-type dopant, such as phosphorus (P). Due to the similarities in the processes, detailed descriptions for formation of the third epitaxial feature 246 will not be repeated.

Figure 31:
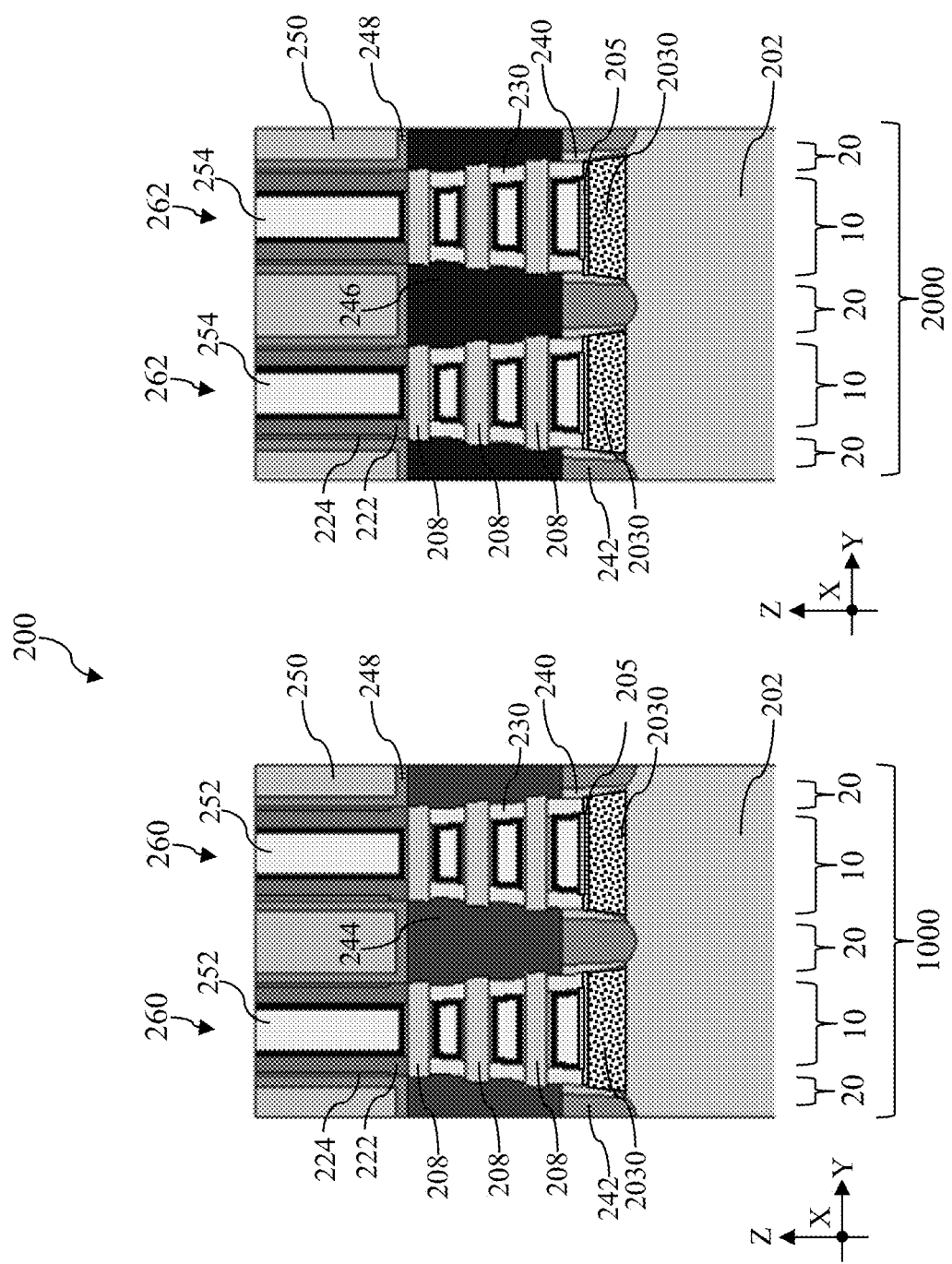
Figure 32:
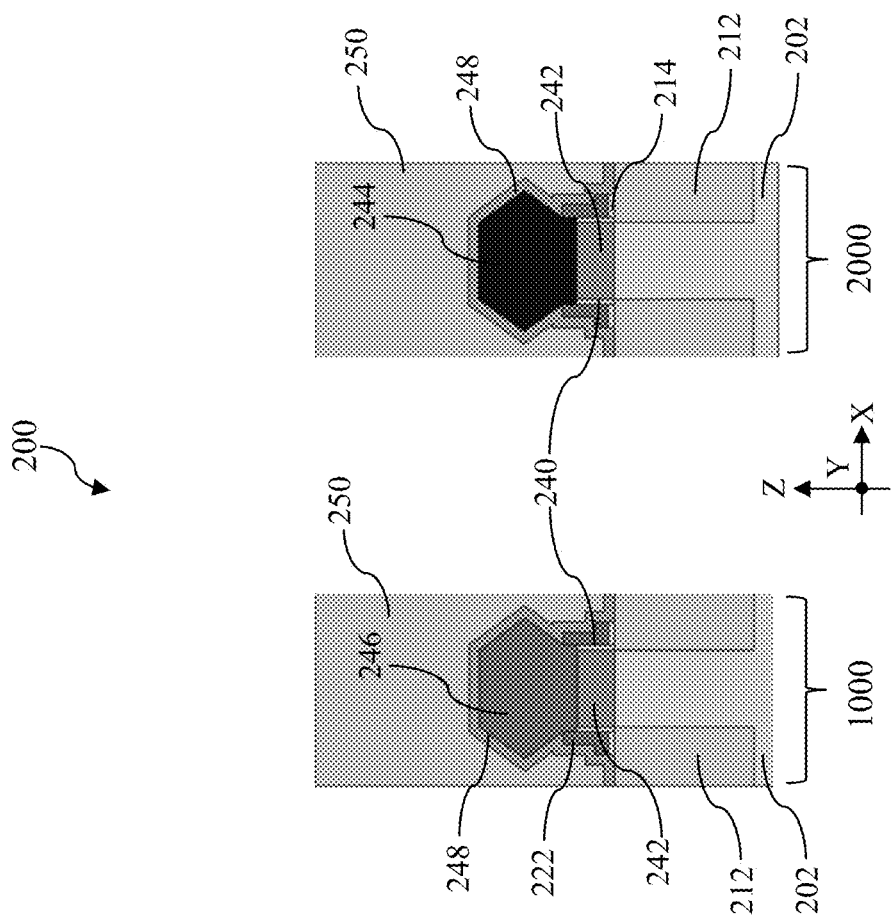

Referring to FIGS. 18, 31 and 32, method 300 includes a block 332 where the dummy gate stack 220 is replaced with a gate structure. Because operations and device structures at block 332 are substantially similar to those at block 132 of method 100, detailed description of block 332 is omitted for brevity.

In some embodiments illustrated in FIGS. 31 and 32, the semiconductor device 200 or the workpiece 200 includes a first device region 1000 and a second device region 2000. In the embodiment depicted in FIGS. 31 and 32, the first device region 1000 is a p-type device region and the second device region 2000 is an n-type device region. The p-type second epitaxial feature 244 is formed in the first device region 1000. The n-type third epitaxial feature 246 is formed in the second device region 2000. After the channel members 208 are released, first gate structures 252 are formed in the first device region 1000 and the second gate structure 254 are formed in the second device region 2000. Each of the first gate structure 252 and the second gate structure 254 wraps around each of the channel members 208, which are formed from the channel layers 208. Each of the first gate structure 252 and the second gate structure 254 may be a high-K metal gate structure. Because operations and device structures at block 332 are substantially similar to those at block 132 of method 100, description of block 332 is simplified for brevity.

Upon conclusion of the operations at block 332, p-type MBC transistors 260 and n-type MBC transistors 262 are substantially formed in the first device region 1000 and the second device region 2000, respectively. As shown in FIG. 31, in the first device region 1000, the first gate structure 252 wraps around each of the channel members 208 in the channel region 10. A bottommost surface of the first gate structure 252 is disposed on the bottom capping feature 205, which is disposed on the bottom oxide feature 2030. Unlike the bottom dielectric feature 234, the bottom oxide feature 2030 is formed by oxidization, not deposition, and does not include any seam or void. The bottom oxide feature 2030 is spaced apart from the first epitaxial feature 242 by the liner 240. Put differently, two adjacent bottom oxide features 2030 sandwich a first epitaxial feature 242. Similarly, the bottom capping feature 205 is spaced apart from the first epitaxial feature 242 by the liner 240. Two adjacent bottom capping features 205 in two adjacent channel regions sandwich a first epitaxial feature 242. Each of the first epitaxial feature 242 is spaced apart from the bottom capping feature 205 by the liner 240. The second epitaxial feature 244 is disposed on the top surface of the first epitaxial feature 242. The second epitaxial feature 244 is in contact with sidewalls of the channel members 208.

Referring to FIG. 18, method 300 includes a block 334 where further processes are performed. Because operations and device structures at block 334 are substantially similar to those at block 134 of method 100, description of block 334 is omitted for brevity.

Although not intended to be limiting, one or more embodiments of the present disclosure provide benefits to a semiconductor device and the formation thereof. For example, embodiments of the present disclosure provide a bottom dielectric feature (or a bottom oxide feature) below vertically-stacked channel members and in contact with a bottom surface of a gate structure surrounding each of the vertically-stacked channel members. The bottom dielectric feature (or the bottom oxide feature) is covered by a undoped or less conductive first epitaxial feature, which is not in contact with the channel members. A second epitaxial feature is disposed on the first epitaxial feature and is in contact with the sidewalls of the channel members. The bottom dielectric feature (or the bottom oxide feature) as well as the first epitaxial feature of the present disclosure may reduce gate-drain capacitance ($C_{gd}$) and leakage through the bulk substrate. The use the bottom dielectric feature (or the bottom oxide feature) may make it unnecessary to implement other leakage-prevention features, such as an anti-punch-through (APT) region below the channel members.

In one exemplary aspect, the present disclosure is directed to a semiconductor device. The semiconductor device includes a bottom dielectric feature on a substrate, a plurality of channel members directly over the bottom dielectric feature, a gate structure wrapping around each of the plurality of channel members, two first epitaxial features sandwiching the bottom dielectric feature along a first direction, and two second epitaxial features sandwiching the plurality of channel members along the first direction.

In some embodiments, the bottom dielectric feature includes a seam. In some embodiments, the bottom dielectric feature includes silicon oxide, silicon nitride, silicon oxycarbide, or silicon oxycarbonitride. In some implementations, the bottom dielectric feature consists essentially of silicon germanium oxide. In some instances, the two first epitaxial features include silicon, silicon germanium, or silicon arsenide. In some embodiments, the two second epitaxial features include phosphorus doped silicon or boron doped silicon germanium. In some implementations, the two first epitaxial features are spaced apart from the bottom dielectric feature by a liner, and a composition of the liner is different from a composition of the bottom dielectric feature. In some instances, the bottom dielectric feature includes a thickness measured between the substrate and a bottom surface of the gate structure, and the thickness is between about 8 nm and about 10 nm.

In another exemplary aspect, the present disclosure is directed to a semiconductor device. The semiconductor device includes a bottom dielectric feature on a substrate, a plurality of channel members directly over the bottom dielectric feature, and a gate structure wrapping around each of the plurality of channel members. The bottom dielectric feature is disposed between the substrate and a bottom surface of the gate structure, and the bottom dielectric feature includes a seam. In some implementations, the bottom dielectric feature includes silicon oxide, silicon nitride, silicon oxycarbide, or silicon oxycarbonitride. In some embodiments, the bottom dielectric feature consists essentially of silicon germanium oxide. In some implementations, the semiconductor device may further include two first epitaxial features sandwiching the bottom dielectric feature along a first direction, and two second epitaxial features sandwiching the plurality of channel members along the first direction. In some instances, the two first epitaxial features include silicon, silicon germanium, or silicon arsenide, and the two second epitaxial features include phosphorus doped silicon or boron doped silicon germanium.

In yet another exemplary aspect, the present disclosure is directed to a method. The method includes depositing a bottom sacrificial layer on a substrate, depositing a bottom capping layer on the bottom sacrificial layer, depositing, on the bottom capping layer, a stack formed of a plurality of channel layers interleaved by a plurality of sacrificial layers, forming a fin-shaped structure out of the substrate, the bottom sacrificial layer, the bottom capping layer, and the stack, forming a dummy gate stack over a channel region of the fin-shaped structure, forming a spacer layer over the dummy gate stack, recessing a source/drain region of the fin-shaped structure to expose sidewalls of the bottom sacrificial layer, the bottom capping layer, and the stack, selectively and partially recessing the plurality of sacrificial layers to form inner spacer recesses, forming inner spacer features in the inner spacer recesses, and replacing the bottom sacrificial layer with a bottom dielectric feature.

In some embodiments, the replacing of the bottom sacrificial layer includes selectively removing the bottom sacrificial layer to form a bottom opening and forming a bottom dielectric feature in the bottom opening. In some implementations, the replacing of the bottom sacrificial layer includes oxidizing the bottom sacrificial layer to form silicon germanium oxide. In some instances, the bottom sacrificial layer and the plurality of sacrificial layers include silicon germanium, the bottom sacrificial layer includes a first germanium concentration, and the plurality of sacrificial layers include a second germanium concentration greater than the first germanium concentration. In some embodiments, the first germanium concentration is between about 10% and about 25%, and the second germanium concentration is between about 30% and about 45%. In some implementations, the method may further include depositing a liner over the substrate and the dummy gate stack, anisotropically etching the liner to expose the substrate in the source/drain region of the fin-shaped structure, forming a first epitaxial feature in the source/drain region, removing the liner that is not covered by the first epitaxial feature, and forming a second epitaxial feature on the first epitaxial feature. In some instances, the first epitaxial feature includes silicon, silicon germanium, or silicon arsenide, and the second epitaxial feature includes phosphorus doped silicon or boron doped silicon germanium.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a bottom sacrificial layer on a substrate,
        a bottom capping layer on the bottom sacrificial layer, and
        a stack on the bottom capping layer, the stack comprising a plurality of channel layers interleaved by a plurality of sacrificial layers;
    patterning the stack and a portion of the substrate to form a fin-shaped structure having a channel region and a source/drain region;
    forming a dummy gate stack over the channel region;
    recessing the source/drain region to form a source/drain trench that exposes sidewalls of the bottom sacrificial layer, sidewalls of the bottom capping layer, sidewalls of the plurality of channel layers, and sidewalls of the plurality of sacrificial layers;
    selectively and partially recessing the sidewalls of the plurality of sacrificial layers to form inner spacer recesses;
    forming inner spacer features in the inner spacer recesses;
    after the forming of the inner spacer features, selectively removing the bottom sacrificial layer to form a bottom vacancy;
    forming a bottom dielectric layer in the bottom vacancy;
    depositing a dielectric liner over sidewalls of the dummy gate stack, sidewalls of the inner spacer features, and sidewalls of the bottom dielectric layer;
    forming a first epitaxial layer over the source/drain region;
    selectively removing the dielectric liner not covered by the first epitaxial layer;
    after the selectively removing, depositing a second epitaxial layer over the dielectric liner and the first epitaxial layer;
    removing the dummy gate stack;
    selectively removing the plurality of sacrificial layers in the channel region to release the plurality of channel layers as channel members; and
    forming a gate structure to wrap around each of the channel members.

2. The method of claim 1, wherein a composition of the plurality of the sacrificial layers is different from a composition of the bottom dielectric layer.

3. The method of claim 1,
    wherein the plurality of sacrificial layers and the bottom dielectric layer comprise silicon and germanium,
    wherein a germanium concentration of the plurality of sacrificial layers is greater than a germanium concentration of the bottom dielectric layer.

4. The method of claim 1, wherein the dielectric liner comprises silicon oxide or silicon oxycarbide.

5. The method of claim 1, wherein the source/drain trench extends into the substrate.

6. The method of claim 1, further comprising:
before the forming of the first epitaxial layer, etching back the dielectric liner to expose a portion of the substrate in the source/drain trench.

7. The method of claim 6, wherein the forming of the first epitaxial layer comprises forming the first epitaxial layer in a bottom-up fashion from the exposed portion of the substrate in the source/drain trench.

8. The method of claim 1, wherein the bottom sacrificial layer comprises a thickness between about 8 nm and about 10 nm.

9. The method of claim 1, wherein a top surface of the first epitaxial layer is higher than a top surface of the bottom dielectric layer.

10. A method, comprising:
receiving a workpiece comprising:
    a bottom sacrificial layer on a substrate,
    a bottom capping layer on the bottom sacrificial layer, and
    a stack on the bottom capping layer, the stack comprising a plurality of channel layers interleaved by a plurality of sacrificial layers;
patterning the stack and a portion of the substrate to form a fin-shaped structure having a channel region and a source/drain region;
forming a dummy gate stack over the channel region;
recessing the source/drain region to form a source/drain trench that exposes sidewalls of the bottom sacrificial layer, sidewalls of the bottom capping layer, sidewalls of the plurality of channel layers, and sidewalls of the plurality of sacrificial layers;
selectively and partially recessing the sidewalls of the plurality of sacrificial layers to form inner spacer recesses;
forming inner spacer features in the inner spacer recesses;
after the forming of the inner spacer features, oxidizing the bottom sacrificial layer to form a bottom dielectric layer between the bottom capping layer and the substrate;
depositing a dielectric liner over sidewalls of the dummy gate stack, sidewalls of the inner spacer features, and sidewalls of the bottom dielectric layer;
forming a first epitaxial layer over the source/drain region;
selectively removing the dielectric liner not covered by the first epitaxial layer;
after the selectively removing, depositing a second epitaxial layer over the dielectric liner and the first epitaxial layer;
removing the dummy gate stack;
selectively removing the plurality of sacrificial layers in the channel region to release the plurality of channel layers as channel members; and
forming a gate structure to wrap around each of the channel members.

11. The method of claim 10, wherein the bottom capping layer comprises silicon.

12. The method of claim 10,
wherein the plurality of sacrificial layers and the bottom dielectric layer comprise silicon and germanium,
wherein a germanium concentration of the plurality of sacrificial layers is greater than a germanium concentration of the bottom dielectric layer.

13. The method of claim 10,
wherein the bottom capping layer comprises a thickness between about 3 nm and about 4 nm,
wherein the bottom sacrificial layer comprises a thickness between about 8 nm and about 10 nm.

14. A method, comprising:
depositing a bottom sacrificial layer on a substrate;
depositing a bottom capping layer on the bottom sacrificial layer;
depositing, on the bottom capping layer, a stack formed of a plurality of channel layers interleaved by a plurality of sacrificial layers;
forming a fin-shaped structure out of the substrate, the bottom sacrificial layer, the bottom capping layer, and the stack;
forming a dummy gate stack over a channel region of the fin-shaped structure;
forming a spacer layer over the dummy gate stack;
recessing a source/drain region of the fin-shaped structure to expose sidewalls of the bottom sacrificial layer, the bottom capping layer, and the stack;
selectively and partially recessing the plurality of sacrificial layers to form inner spacer recesses;
forming inner spacer features in the inner spacer recesses; and
after the forming of the inner spacer features, replacing the bottom sacrificial layer with a bottom dielectric feature.

15. The method of claim 14, wherein the replacing of the bottom sacrificial layer comprises:
selectively removing the bottom sacrificial layer to form a bottom opening; and
forming a bottom dielectric feature in the bottom opening.

16. The method of claim 14, wherein the replacing of the bottom sacrificial layer comprises oxidizing the bottom sacrificial layer to form silicon germanium oxide.

17. The method of claim 14,
wherein the bottom sacrificial layer and the plurality of sacrificial layers comprise silicon germanium,
wherein the bottom sacrificial layer comprises a first germanium concentration, and
wherein the plurality of sacrificial layers comprise a second germanium concentration greater than the first germanium concentration.

18. The method of claim 17,
wherein the first germanium concentration is between about 10% and about 25%, and
wherein the second germanium concentration is between about 30% and about 45%.

19. The method of claim 14, further comprising:
depositing a liner over the substrate and the dummy gate stack;
anisotropically etching the liner to expose the substrate in the source/drain region of the fin-shaped structure;
forming a first epitaxial feature in the source/drain region;
removing the liner that is not covered by the first epitaxial feature; and
forming a second epitaxial feature on the first epitaxial feature.

20. The method of claim 19,
wherein the first epitaxial feature comprises silicon, silicon germanium, or silicon arsenide, and
wherein the second epitaxial feature comprises phosphorus doped silicon or boron doped silicon germanium.

* * * * *